(12) United States Patent
Gotoh

(10) Patent No.: US 8,179,622 B2
(45) Date of Patent: May 15, 2012

(54) PHOTOSENSITIVE TRANSFER MATERIAL, MEMBER FOR DISPLAY DEVICE, PROCESS FOR PRODUCING THE MEMBER, BLACK MATRIX, COLOR FILTER, PROCESS FOR PRODUCING THE COLOR FILTER, SUBSTRATE FOR DISPLAY DEVICE, AND DISPLAY DEVICE

(75) Inventor: Hidenori Gotoh, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 448 days.

(21) Appl. No.: 12/158,578

(22) PCT Filed: Dec. 6, 2006

(86) PCT No.: PCT/JP2006/324352
§ 371 (c)(1),
(2), (4) Date: Jun. 20, 2008

(87) PCT Pub. No.: WO2007/072682
PCT Pub. Date: Jun. 28, 2007

(65) Prior Publication Data
US 2009/0296248 A1    Dec. 3, 2009

(30) Foreign Application Priority Data

Dec. 22, 2005    (JP) .................................. 2005-370822

(51) Int. Cl.
*G02B 5/22* (2006.01)
*G02F 1/1335* (2006.01)
(52) U.S. Cl. ........................................ 359/891; 349/106
(58) Field of Classification Search ................... 359/891
See application file for complete search history.

(56) References Cited

U.S. PATENT DOCUMENTS
2003/0129504 A1* 7/2003 Wakata et al. .................... 430/5

FOREIGN PATENT DOCUMENTS
| JP | 2002-131525 A | 5/2002 |
| JP | 2003-185814 A | 7/2003 |
| JP | 2003-227918 A | 8/2003 |
| JP | 2003-330183 A | 11/2003 |
| JP | 2004-012758 A | 1/2004 |
| JP | 2005-003861 A | 1/2005 |

* cited by examiner

*Primary Examiner* — Jade R Chwasz
(74) *Attorney, Agent, or Firm* — Sughrue Mion, PLLC

(57) ABSTRACT

A photosensitive transfer material including, on or above a temporary support, in the following order from the temporary support side, at least a thermoplastic resin layer and a photosensitive resin layer, wherein the tensile elongation at break of the thermoplastic resin layer is 6% or more, the yield stress or breaking strength thereof is $5 \times 10^6$ Pa or more, and the melt viscosity η at 110° C. thereof is 6000 Pa·s or less.

15 Claims, 3 Drawing Sheets

DELTA ARRANGEMENT

DELTA ARRANGEMENT

LATTICE STRUCTURE OR STRIPE STRUCTURE

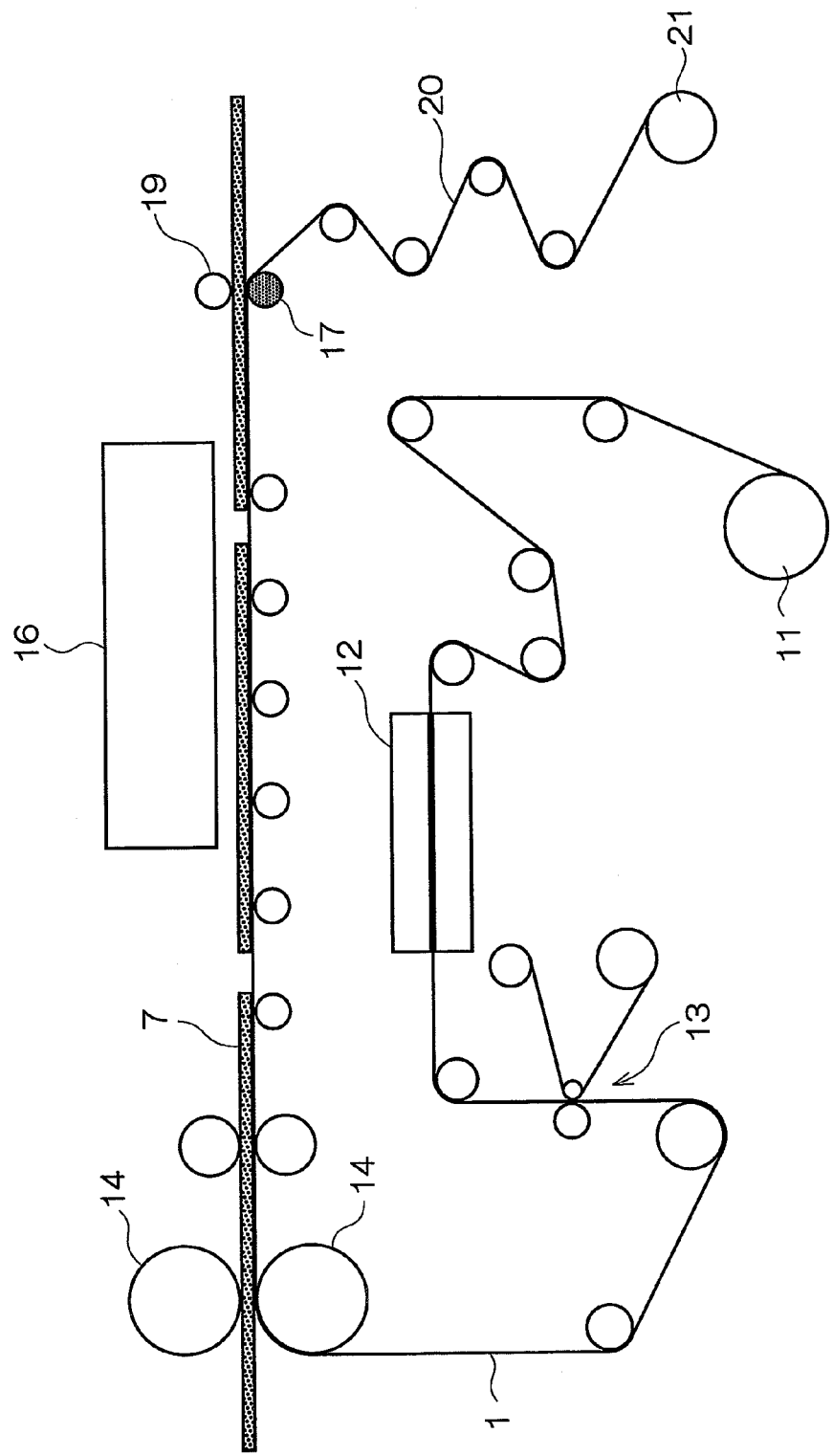

PHOTOSENSITIVE TRANSFER MATERIAL, MEMBER FOR DISPLAY DEVICE, PROCESS FOR PRODUCING THE MEMBER, BLACK MATRIX, COLOR FILTER, PROCESS FOR PRODUCING THE COLOR FILTER, SUBSTRATE FOR DISPLAY DEVICE, AND DISPLAY DEVICE

TECHNICAL FIELD

The present invention relates to a photosensitive transfer material suitable for forming a member for a display device, which constitutes a liquid crystal display device and so on, a member for a display device and a color filter that are constituted of the photosensitive transfer material, a substrate for a display device and a display device, in particular, to a substrate for a liquid crystal display device and a liquid crystal display device, which enable to realize a high quality image display.

BACKGROUND ART

A photosensitive transfer material for transferring a photosensitive resin layer on a substrate is used for preparing printed wirings, intaglio and relief printing, name plates, multi-color test printing samples, offset printing plates, color filters and so on. The photosensitive transfer material normally has a temporary support, an intermediate layer (separating layer) or a thermoplastic resin layer and an intermediate layer, and a photosensitive resin layer. When an image is formed on a substrate surface, a separately prepared substrate and a photosensitive resin layer of the photosensitive transfer material are superposed (lamination step), followed by peeling the temporary support alone, further followed by imagewise exposing the photosensitive resin layer through the intermediate layer, followed by developing to form an image.

In the lamination step, conventionally, after the lamination, the temporary support was cut in the proximity of the substrate and, after cooling, the temporary support was peeled off the substrate. However, in order to simplify an equipment to reduce an equipment cost and a space, it is strongly desired to, without cutting the temporary support, continuously peel the temporary support.

However, when, in the conventionally transfer material, the temporary support was continuously peeled, in the proximity of a surface of a thermoplastic resin layer of the transfer material, in some cases, defects such as cracks and chips were caused. Furthermore, in the exposure step, since the exposure is applied through the thermoplastic resin layer, owing to the defects of the thermoplastic resin layer, in part of the exposed image, defects such as crack and distortion are caused in some cases. As the result, there are problems in that the display unevenness, display defects and so on are caused.

On the other hand, as described in Japanese Patent Application Laid-Open (JP-A) No. 2003-227918, in a peeling step where the temporary support is peeled off the photosensitive transfer material, a process where, after the layered product is cooled, the cooled layered product is peeled off the temporary support side while heating a peeling roller is known. However, since a step of heating a peeling roller increases, the equipment cannot be simplified.

DISCLOSURE OF THE INVENTION

Problem to Be Solved by the Invention

The present invention intends to overcome the foregoing existing problems and to achieve objects described below.

That is, the invention intends to provide a photosensitive transfer material that inhibits defects such as cracks and chips, which are generated in the proximity of a surface of a thermoplastic resin layer, from occurring and provides a display device free from display unevenness and display defects due to the defects of the thermoplastic resin layer and the display unevenness, display defects and so on due to the transfer defects; a member for a display device, which uses the photosensitive transfer material and a process for producing the member for a display device; a black matrix; a color filter and a producing process thereof; a substrate for a display device, which has excellent display performance; and a display device.

Means for Solving Problem

The inventors studied hard to find the means for inhibiting defects of the thermoplastic resin layer from occurring. As the result, it was found that when a thermoplastic resin layer is formed with specified physical properties, defects during transfer are eliminated, and, thereby, the invention came to completion.

Specific means for overcoming the problems are as follows.

A first aspect of the present invention provides a photosensitive transfer material that includes, on or above a temporary support, in the following order from the temporary support side, at least a thermoplastic resin layer; and a photosensitive resin layer, wherein the tensile elongation at break of the thermoplastic resin layer is 6% or more, the yield stress or breaking strength thereof is $5 \times 10^6$ Pa or more, and the melt viscosity 1 at 110° C. thereof is 6000 Pa·s or less.

A second aspect of the invention provides a method for producing a member for a display device, which includes transferring the photosensitive transfer material involving the first aspect of the invention onto a substrate.

A third aspect of the invention provides a member for a display device produced by the method for producing the member for a display device involving the second aspect of the invention.

A fourth aspect of the invention provides a black matrix produced by the method for producing the member for a display device involving the second aspect of the invention.

A fifth aspect of the invention provides a color filter that includes on or above a substrate, two or more colored pixel groups different in color from each other, wherein the respective colored pixels constituting the colored pixel groups are demarcated from each other by the black matrix involving the fourth aspect of the invention.

A sixth aspect of the invention provides a method for producing a color filter, including, after the black matrix involving the fourth aspect of the invention is formed, forming a colored pixel group made of a plurality of colored pixels having two or more colors, wherein the plurality of colored pixels are formed by applying a liquid droplet of a colored liquid composition.

A seventh aspect of the invention provides a substrate for a display device that includes the member for a display device involving the third aspect of the invention.

An eighth aspect of the invention provides a display device that includes the substrate for a display device involving the seventh aspect of the invention.

Effect of the Invention

According to the invention, a photosensitive transfer material that is able to control the peeling unevenness of a temporary support without increasing a facility at the time of transfer, and is able to inhibit defects such as cracks and chips, which are generated in the proximity of a surface of a thermoplastic resin layer, from occurring and provide a display device free from display unevenness and display defects due to the defects of the thermoplastic resin layer and the display unevenness, display defects and so on due to the transfer defects; a member for a display device, which uses the photosensitive transfer material and a method for producing thereof; a black matrix; a color filter and a producing process thereof; a substrate for a display device; and a display device.

BRIEF DESCRIPTION OF THE DRAWINGS

FIG. 2 is a conceptual diagram showing an essential portion of a device for peeling and laminating a photosensitive transfer material.

BEST MODE FOR CARRYING OUT THE INVENTION

Figure 1A:
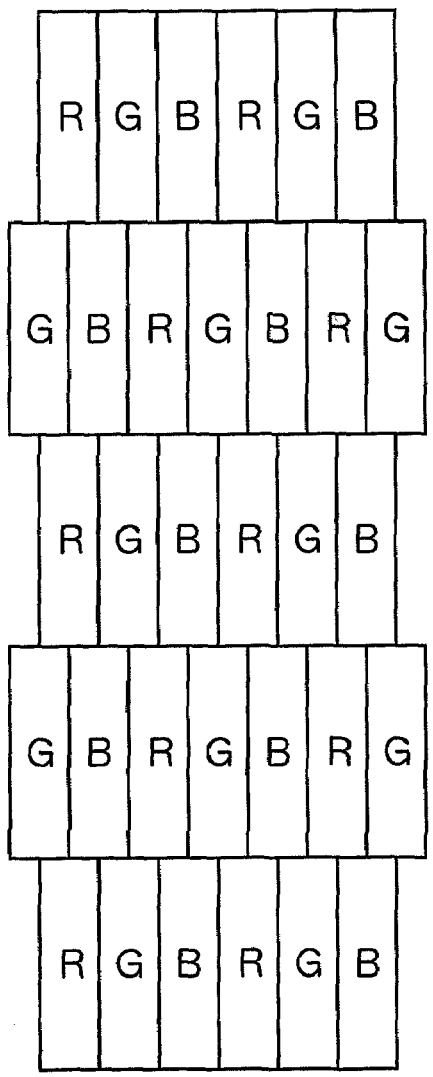
FIG. 1A is a diagram showing a pattern (delta arrangement) of a color filter.

In what follows, the present invention will be detailed.
<<Photosensitive Transfer Material>>

A photosensitive transfer material of the invention is a photosensitive transfer material that includes, on or above a temporary support, in the following order from the temporary support side, at least a thermoplastic resin layer; and a photosensitive resin layer, wherein the tensile elongation at break of the thermoplastic resin layer is 6% or more, the yield stress or breaking strength thereof is $5 \times 10^6$ Pa or more, and the melt viscosity η at 110° C. thereof is 6000 Pa·s or less.

Furthermore, as needs arise, the photosensitive transfer material may have other layers such as an intermediate layer.
—Thermoplastic Resin Layer—

The photosensitive transfer material of the invention has at least one layer of thermoplastic resin layer. The thermoplastic resin layer, from the viewpoints of enabling to carry out the alkali development and capable of inhibiting a transfer receiver from being contaminated due to the thermoplastic resin layer per se, which ran over during the transfer, is preferably alkali soluble. Furthermore, the thermoplastic resin layer, when a photosensitive resin layer described below is transferred on a transfer receiver, has a function as a cushion material that effectively inhibits transfer defects from generating due to unevenness present on the transfer receiver. The thermoplastic resin layer is a layer deformable corresponding to the unevenness on the transfer receiver when the photosensitive transfer material is heated and adhered on the transfer receiver.

In the invention, a layer thickness of the thermoplastic resin layer is preferably in the range of 2 to 20 μm. When the layer thickness of the thermoplastic resin layer is in the range of 2 to 20 μm, the thermoplastic resin layer is sufficiently peeled off a temporary support, without generating exposure defect due to a thickness variation, a precise pattern may be formed and one-time development step is enough to develop uniformly.

Furthermore, the layer thickness is preferably in the range of 2 to 18 μm and more preferably in the range of 3 to 16 μm.

The thermoplastic resin layer is constituted of at least a thermoplastic resin and may appropriately use, as needs arise, other components. The thermoplastic resin may be appropriately selected without particular restriction. However, ones having a substantial softening temperature of 80° C. or less are preferred.

A resin (polymer) contained in the thermoplastic resin layer is preferably at least one kind selected from a saponified product of a copolymer of ethylene and acrylic acid ester, a saponified product of a copolymer of styrene and (meth) acrylic acid ester, a saponified product of a copolymer of vinyl toluene and (meth)acrylic acid ester, poly(meth)acrylic acid ester, and a saponified product of (meth)acrylic acid ester copolymer of butyl(meth)acrylate and vinyl acetate. Furthermore, among organic polymers due to "Plastic Seino Binran" ("Plastic Performance Handbook", written and edited by The Japan Plastics Industry Federation and Zen-Nippon Plastic Seikei Kogyo Rengokai and published on Oct. 25, 1968 by Kogyo Chosakai Publishing, Inc.), ones soluble in an alkaline aqueous solution may be used as well. These may be used singularly or in a combination of two or more kinds thereof. Furthermore, among the thermoplastic resins, ones having the softening temperature of 80° C. or less are preferred. In the invention, "(meth)acrylic acid" generically means acrylic acid and methacrylic acid and the situation is same as well in the case of derivatives thereof.

Among resins contained in the thermoplastic resin layer, ones having a weight average molecular weight in the range of 50,000 to 500,000 (Tg=0 to 140° C.) and more preferably in the range of 60,000 to 200,000 (Tg=30 to 110° C.) may be selected and used. Specific examples thereof include resins soluble in an alkali aqueous solution, which are described in each of the gazette descriptions of Japanese Patent Application Publication (JP-B) Nos. 54-34327, 55-38961, 58-12577 and 54-25957, Japanese Patent Application Laid-Open (JP-A) No. 61-134756, JP-B No. 59-44615, JP-A Nos. 54-92723, 54-99418, 54-137085, 57-20732, 58-93046, 59-97135, 60-159743, 60-247638, 60-208748, 60-214354, 60-230135, 60-258539, 61-169829, 61-213213, 63-147159, 63-213837, 63-266448, 64-55551, 64-55550, 02-191955, 02-199403, 02-199404, 02-208602 and Japanese Patent Application No. 04-39653. Particularly preferable examples include a methacrylic acid/2-ethylhexyl acrylate/benzyl methacrylate/methyl methacrylate copolymer described in the description of JP-A No. 63-147159.

Among the various resins, ones having a weight average molecular weight preferably in the range of 3,000 to 30,000 (Tg=30 to 170° C.) and more preferably in the range of 4,000 to 20,000 (Tg=60 to 140° C.) may be selected and used. The preferable specific examples thereof may be selected from ones described in the foregoing descriptions. Particularly preferably, a styrene/(meth)acrylate copolymer described in the description of JP-B No. 55-38961 and JP-A No. 05-241340 respectively is cited.

To a thermoplastic resin layer, as other components other than the thermoplastic resin, in order to control the adhesiveness with a temporary support, within a range where the softening temperature does not substantially exceeds 80° C., various kinds of polymers, plasticizers, supercooling materials, adhesion improvers, surfactants and releasing agents and the like may be added. These may be used to control Tg as well. Specific examples of preferable plasticizers include polypropylene glycol, polyethylene glycol, dioctyl phthalate, diheptyl phthalate, dibutyl phthalate, tricresyl phosphate, cresyldiphenyl phosphate, biphenyldiphenyl phosphate, polyethylene glycol mono(meth)acrylate, polyethylene glycol di(meth)acrylate, polypropylene glycol mono(meth)acrylate, polypropylene glycol di(meth)acrylate, a product of addition reaction of an epoxy resin with polyethylene glycol mono(meth)acrylate, a product of addition reaction of an organic diisocyanate with polyethylene glycol mono(meth)acrylate, a product of addition reaction of an organic diisocyanate with polypropylene glycol mono(meth)acrylate and a product of condensation reaction of bisphenol A with polyethylene glycol mono(meth)acrylate. An amount of plasticizer in the thermoplastic resin layer is generally 200% by weight or less relative to the thermoplastic resin and preferably in the range of 20 to 100% by weight.

The surfactant, as far as it is miscible with the thermoplastic resin of the invention, may be used. Preferable surfactants used in the invention include surfactants described in paragraphs [0015] to [0024] of JP-A No. 2003-337424, paragraphs [0012] to [0017] of JP-A No. 2003-177522, paragraphs [0012] to [0015] of JP-A No. 2003-177523, paragraphs [0010] to [0013] of JP-A No. 2003-177521, paragraphs [0010] to [0013] of JP-A No. 2003-177519, paragraphs [0012] to [0015] of JP-A No. 2003-177520, paragraphs [0034] to [0035] of JP-A No. 11-133600 and JP-A No. 06-16684. In order to obtain higher advantage, any one or two or more kinds of a fluorinated surfactant and/or a silicon-based surfactant (fluorinated surfactant, or silicon-based surfactant, surfactant containing both of fluorine atom and silicon atom) are preferred, a fluorinated surfactant being most preferred.

When the fluorinated surfactant is used, the number of fluorine atoms in a fluorine-containing substitution group in a molecule of the surfactant is preferably in the range of 1 to 38, more preferably in the range of 5 to 25 and most preferably in the range of 7 to 20. When the number of fluorine atoms is excessive, the solubility to an ordinary solvent that does not contain fluorine is unfavorably deteriorated. When the number of fluorine atoms is too less, an improvement effect in the unevenness is not unfavorably obtained.

Examples of particularly preferable surfactants include copolymers that contain monomers expressed by a formula (a) and a formula (b) below and have a weight ratio of the formula (a)/formula (b) in the range of 20/80 to 60/40.

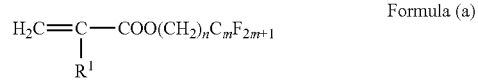

Formula (a)

$$H_2C=C-COO(CH_2)_nC_mF_{2m+1}$$
$$|$$
$$R^1$$

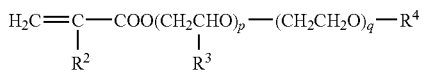

Formula (b)

$$H_2C=C-COO(CH_2CHO)_p-(CH_2CH_2O)_q-R^4$$
$$|\qquad\qquad |$$
$$R^2\qquad\qquad R^3$$

(In the formulas, $R^1$, $R^2$ and $R^3$, respectively and independently, express a hydrogen atom or a methyl group, and $R^4$ expresses a hydrogen atom or an alkyl group having 1 to 5 carbon atoms. Furthermore, n expresses an integer in the range of 1 to 18 and m expresses an integer in the range of 2 to 14. Still furthermore, p and q express an integer in the range of 0 to 18; however, a case where p and q are simultaneously 0 is not included.)

Specific examples of the surfactants are described in Table 1 in paragraph [0068] of JP-A No. 2003-337424.

Furthermore, commercially available surfactants below are used as these are. Examples of the commercially available surfactants include fluorinated surfactants such as Eftop EF301 and EF302 (trade name, manufactured by Shin-Akita Kasei K. K.), Florad FC 430 and 431 (trade name, manufactured by Sumitomo 3M, Ltd.), Megaface F-780-F, F171, F173, F176, F189 and R08 (trade name, manufactured by DIC Corporation), Surflon S-382, SC101, 102, 103, 104, 105 and 106 (trade name, manufactured by Asahi Glass Co., Ltd.); and silicone-based surfactants. Furthermore polysiloxane polymer KP-341 (trade name, manufactured by Shin-Etsu Chemical Industries Co., Ltd.) and Troysol S-366 (trade name, manufactured by Troy Chemical Industries, Inc.) as well are used as the silicone-based surfactants.

In the invention, a thermoplastic resin layer has the tensile elongation at break of 6% or more, the yield stress or breaking strength of $5\times10^6$ Pa or more, and the melt viscosity η at 110° C. of 6000 Pa·s or less. When the thermoplastic resin layer satisfies a range of these numerical value ranges, defects such as cracks and chips generated in the proximity of a surface of the thermoplastic resin layer are inhibited from occurring, resulting in suppressing the display unevenness and display defects when the member for a display device is used.

In what follows, the tensile elongation at break, breaking strength and melt viscosity will be described.

In the invention, the tensile elongation at break of the thermoplastic resin layer is 6% or more. When the tensile elongation at break is set within the range, sufficient strength is imparted to the thermoplastic resin layer; accordingly, there is no fear in that the thermoplastic resin layer is broken. The tensile elongation at break is desirably as large as possible, preferably in the range of 7 to 100%, more preferably in the range of 8 to 80% and particularly preferably in the range of 10 to 50%.

As means for achieving the tensile elongation at break within the foregoing range, similarly to a process below where the melt viscosity η is controlled, a process where, in a polymer, a content of a low molecular weight polymer and a content of the plasticizer are controlled is cited.

Furthermore, in the invention, the yield stress or braking strength of the thermoplastic resin layer is $5\times10^6$ Pa or more. When the breaking strength is set within the range, sufficient strength is imparted to the thermoplastic resin layer; accordingly, there is no fear in that the thermoplastic resin layer is broken. The yield stress or breaking strength is desirably as large as possible, preferably in the range of $6\times10^6$ to $90\times10^6$ Pa, more preferably in the range of $8\times10^6$ to $50\times10^6$ Pa and particularly preferably in the range of $10\times10^6$ to $30\times10^6$ Pa.

As means for achieving the yield stress or breaking strength within the foregoing range, similarly to a process below where the melt viscosity η is controlled, a process where, in a polymer, a content of a low molecular weight polymer and a content of the plasticizer are controlled is cited.

In the invention, the yield stress means the yield point and means, when in the tensile test, a test piece elongates proportional to an increase in a weight and, when the yield point is reached, irrespective of the weight, the elongation increases, a point where the elongation starts increasing. Furthermore, the breaking strength in the invention means, when, in the tensile test, the test piece elongates proportional to an increase in the weight and breaks in the middle of an increase, a point where the test piece is broken.

When both of the yield stress and breaking strength are present, the yield stress is read.

Values of the breaking strength or yield stress and elongation at break are values measured according to processes below.

On a corona-treated Teflon (registered trademark) (polytetrafluoroethylene) sheet, a thermoplastic resin layer-forming coating solution is coated and dried at 100° C. for 5 min to form a model film having a thickness of substantially 15 μm. A sample obtained by cutting the model film into 20 mm×5 mm is supplied to the tensile test by use of Tensilon RTM-100 (trade name, manufactured by Orientec Corporation) and the breaking strength and the elongation at break are calculated. Conditions of the tensile test are as shown below.

Environmental temperature and humidity: 25° C./60% RH
Tensile speed: 20 mm/min (100%/min)

In the invention, the melt viscosity η of the thermoplastic resin layer is 6000 Pa·s or less at 110° C. When the melt viscosity η is within the range, sufficient cushionability is imparted to the thermoplastic resin layer. The melt viscosity is desirably as small as possible to an extent that does not cause the peelability or reticulation, preferably in the range of 200 to 6000 Pa·s, more preferably in the range of 1000 to 5500 Pa·s and particularly preferably in the range of 2000 to 5000 Pa·s. When the melt viscosity is 200 Pa·s or more, during the transfer, the thermoplastic resin layer is inhibited from running over; accordingly, a heat roller of a laminator is not contaminated.

As means for controlling the melt viscosity of the thermoplastic resin layer within the range, a process where a content of a low molecular weight polymer in a polymer that constitutes the thermoplastic resin layer and a content of the plasticizer are controlled is cited.

In the means, a content ratio of a high molecular weight polymer and a low molecular weight polymer in a polymer constituting the thermoplastic resin layer is preferably 10/90 or more and less than 60/40, more preferably 12/88 or more and less than 53/47 and most preferably 15/85 or more and less than 50/50. When the content ratio is 10/90 or more, the peelability is excellent. On the other hand, when the content ratio is less than 60/40, the cushionability is excellent. Here, the low molecular weight polymer means a polymer having a weight average molecular weight of 3000 or more and less than 10000.

Furthermore, an addition amount of the plasticizer is, to a solid content of a binder and the plasticizer contained in the thermoplastic resin layer, preferably in the range of 28 to 43% by weight, more preferably in the range of 30 to 40% by weight and particularly preferably in the range of 32 to 38% by weight. When an addition amount of the plasticizer to the solid content is 28% by weight or more, the cushionability is excellent. When an addition amount of the plasticizer is 43% by weight or less to the solid content, during the transfer, the thermoplastic resin layer is inhibited from running over; accordingly, a heat roller of a laminator is not contaminated.

—Intermediate Layer—

A photosensitive transfer material of the invention may have at least one layer of intermediate layer. The intermediate layer is disposed on or above the thermoplastic resin layer disposed on or above a temporary support and between the thermoplastic resin layer and a photosensitive resin layer described below. When the thermoplastic resin layer and photosensitive resin layer are formed, an organic solvent is used; accordingly, when an intermediate layer is disposed, both layers may be preferably inhibited from mixing with each other.

The intermediate layer is preferred to be one that is dispersed or dissolved in water or an alkali aqueous solution. For constituent materials of the intermediate layer, known ones are used. Examples thereof include a polyvinyl ether/maleic anhydride polymer, a water-soluble salt of carboxyalkyl cellulose, water-soluble cellulose ethers, a water-soluble salt of carboxyalkyl starch, polyvinyl alcohol, polyvinyl pyrolidone, polyacrylamides, water-soluble polyamide, a water-soluble salt of polyacrylic acid, gelatin, an ethylene oxide polymer, a water-soluble salt of a group including various kinds of starches and analogous products thereof, a copolymer of styrene/maleic acid and a maleate resin, which are described in JP-A 46-2121 and JP-B 56-40824.

These may be used singularly or in a combination of two or more kinds thereof.

Among these, water-soluble resins, that is, aqueous high molecular weight materials are preferably used, among these at least polyvinyl alcohol is more preferably used, and a combination of polyvinyl alcohol and polyvinyl pyrolidone is particularly preferably used.

The polyvinyl alcohol may be, without particular restriction, appropriately selected depending on the object, and a saponification degree of polyvinyl alcohol is preferably 80% by mole or more.

When the polyvinyl pyrolidone is used, a content of polyvinyl pyrrolidone is preferably in the range of 1 to 75% by volume, more preferably in the range of 1 to 60% by volume and most preferably in the range of 10 to 50% by volume relative to a solid content of the intermediate layer. When the content is 1% or more by volume, the adhesiveness with the thermoplastic resin layer is sufficiently ensured. On the other hand, when the content is 75% by volume or less, sufficient oxygen blocking property may be achieved.

The intermediate layer involving the invention is preferred to be small in the oxygen permeability. When the oxygen permeability of the intermediate layer is small, that is, the oxygen blocking property is high, an exposure amount during the exposure to the photosensitive resin layer described below may be reduced and an exposure time may be shortened. Furthermore, the resolving power as well is improved.

A layer thickness of the intermediate layer is preferably substantially in the range of 0.1 to 5 μm and more preferably in the range of 0.5 to 2 μm. When the thickness is 0.1 μm or more, the oxygen permeability may be suppressed low. When the thickness is 5 μm or less, a time required for development or removal of an intermediate layer may be shortened.

A film thickness of the intermediate layer is controlled by a concentration of an intermediate layer coating solution.

—Photosensitive Resin Layer—

The photosensitive transfer material of the invention is formed with at least one layer of photosensitive resin layer. The photosensitive resin layer is a layer that, when resin structures such as a spacer and a liquid crystal orientation-controlling projection are formed, forms the resin structures and is constituted including at least a high molecular weight material, a polymerizable monomer and a photopolymerization initiator, as needs arise, a coloring agent and other components. When a coloring agent is contained, a colored pixel and a black matrix that form a color filter are formed.

As the photosensitive resin layer, any one of a positive photosensitive resin layer and a negative photosensitive resin layer is preferably used. However, in order to form a liquid crystal orientation-controlling projection, since the liquid crystal orientation-controlling projection is necessarily formed in a hog-backed sectional shape, a positive photosensitive resin layer is preferred. When the positive photosensitive resin layer is used, the liquid crystal orientation-controlling projection image formed by development is melted by heating during a curing step after a development step and flows and thereby an appropriate hog-backed shape tends to be formed.

On the other hand, in order to form a pillar, a colored pixel and a black matrix, the negative photosensitive resin layer is preferred. This is because the negative photosensitive resin layer is polymerized during the exposure to be less in a shape variation in the following step to result in readily obtaining a desired sectional shape.

Furthermore, when a pillar is formed simultaneously with a liquid crystal orientation-controlling projection, the positive photosensitive resin layer is used for the liquid crystal orientation-controlling projection and, in the upper-most portion of the pillar as well, the positive photosensitive resin layer is used to form a structure as the pillar. In this case, since a cross sectional shape tends to be rounded due to melting, in order to make the influence smaller, a device such as forming a size of an entire pillar larger is preferred.

<Positive Photosensitive Resin Layer>

The positive photosensitive resin layer is formed containing at least two kinds selected from phenol resins and naphthoquinonediazide derivatives. As the phenol resins, for instance, phenol novolak resins and cresol novolak resins are cited. Among these, from the viewpoint of being wide in the development latitude, two kinds of the cresol novolak resins and naphthoquinonediazide derivatives are particularly preferably contained.

—Phenol Novolak Resin—

As the phenol novolak resins, ones having a mole ratio of formaldehyde to phenol substantially in the range of 0.5 to 1.0 are preferred and, from the viewpoint of the developability and burning, ones in the range of 0.8 to 1.0 are more preferred. Furthermore, a weight average molecular weight of the phenol novolak resin is preferably in the range of 300 to 4000 and particularly preferably in the range of 400 to 800.

The phenol novolak resin may be a derivative thereof.

The phenol novolak resins may be used singularly or in a mixture of two or more kinds different in molecular weight, and, within a range that does not damage the object of the invention, other resin such as a cresol novolak resin may be mixed and used.

A content of the phenol novolak resin is, to a total solid content in the positive photosensitive resin layer, preferably in the range of 40 to 90% by weight and more preferably in the range of 60 to 80% by weight.

—Cresol Novolak Resin—

As the cresol novolak resins, ones having a mole ratio of formaldehyde to cresol substantially in the range of 0.7 to 1.0 are preferred and ones in the range of 0.8 to 1.0 are more preferred. Furthermore, a weight average molecular weight of the cresol novolak resin is preferably in the range of 800 to 8,000 and more preferably in the range of 1,000 to 6,000.

An isomer ratio of the cresol novolak resin (molar ratio of o-isomer/m-isomer/p-isomer) is, without particular restriction, appropriately selected according to the object, and, from the viewpoint of improving the developability, a ratio of p-isomer to all isomers is preferably 10% by mole or more and more preferably 20% by mole or more. Furthermore, from the viewpoint of improving the liquid crystal panel performance (burn prevention capability), a ratio of the m-isomer is preferably 5% by mole or more and more preferably 20% by mole or more.

The cresol novolak resins may be used singularly or in a combination of two or more kinds thereof. In this case, other resins such a phenol novolak resin may be mixed to use.

Furthermore, in the invention, as the cresol novolak resin, derivatives of cresol novolak resins such as a reaction product with naphthoquinonediazide sulfonic acid ester may be used.

A usage amount of the cresol novolak resin is preferably in the range of 0.1 to 10 g/m² and more preferably in the range of 0.5 to 5 g/m².

—Naphthoquinonediazide Derivative—

The naphthoquinonediazide derivative is, without particular restriction, appropriately selected according to the object and particularly preferably used together with a cresol novolak resin. The naphthoquinonediazide derivative may be a mono-functional compound, a two- or more-functional compound or a mixture thereof.

As the mono-functional naphthoquinonediazide derivative, for instance, an ester compound obtained by reacting naphthoquinone-4-sulfonic acid chloride or naphthoquinone-5-sulfonic acid chloride and substituted phenol is cited.

As the two- or more-functional naphthoquinonediazide derivative, for instance, an ester compound obtained by reacting naphthoquinone-4-sulfonic acid chloride or naphthoquinone-5-sulfonic acid chloride with a compound having a plurality of phenolic hydroxide groups is preferred. Examples of the compounds having a plurality of phenolic hydroxide groups include polyphenols such as bisphenols, trisphenols and tetrakisphenols; polyfunctional phenols such as dihydroxybenzene and trihydroxybenzene; and bis or tris-dihydroxy benzene or trihydroxy benzene, asymmetric polynuclear phenol or a mixture thereof.

Examples of the compounds having a plurality of phenolic hydroxide groups include 4-t-butylphenol, 4-isoamylphenol, 4-t-octylphenol, 2-isopropyl-5-methylphenol, 2-acetylphenol, 4-hydroxybenzophenone, 3-chlorophenol, 4-benzyloxycarbonylphenol, 4-dodecylphenol, resorcinol, 4-(1-methyl-1-phenylethyl)-1,3-benzenediol, phloroglucinol, 4,4'-dihydroxybenzophenone, bis(4-hydroxyphenyl)methane, 1,1-bis(4-hydroxyphenyl)cyclohexane, 2,2-bis(3-methyl-4-hydroxyphenyl)methane, 2,3,4,4'-tetrahydroxybenzophenone and 4,4'-[(4-hydroxyphenyl)methylene]bis[2-cyclohexyl-5-methylphenol].

Examples of the naphthoquinonediazide derivatives include 4'-t-octylphenylnaphthoquinonediazide-4-sulfonate, 4'-t-octylphenylnaphthoquinonediazide-5-sulfonate, 4'-benzoylphenylnaphthoquinonediazide-5-sulfonate and a reaction product of 2,3,4,4'-tetrahydroxybenzophenone and 1,2-naphthoquinonediazide-5-sulfonic acid chloride. These may be used singularly or in a combination of two or more kinds thereof.

An addition amount of a naphthoquinonediazide derivative in the photosensitive resin layer is, to 100 parts by weight of the cresol novolak resin, preferably in the range of 1 to 200 parts by weight and more preferably in the range of 5 to 50 parts by weight.

—Other Additives—

The positive photosensitive resin layer may contain, in order to promote the developability of the positive photosensitive resin layer, a bivalent or more aliphatic carboxylic acid or a bivalent to hexavalent phenol compound.

Examples of the bivalent or more carboxylic acids include malonic acid, succinic acid, fumaric acid, maleic acid, hydroxysuccinic acid, glutaric acid and adipic acid. Among these, malonic acid and succinic acid are preferred.

A content of the bivalent or more carboxylic acid is, to a total solid content in the photosensitive resin layer, preferably in the range of 0.5 to 20% by weight.

Examples of the bivalent to hexavalent phenol compounds include resorcinol, 4-(1-methyl-1-phenylethyl)-1,3-benzenediol, phloroglucinol, 4,4'-dihydroxybenzophenone, bis(4-hydroxyphenyl)methane, 1,1-bis(4-hydroxyphenyl)cyclohexane, 2,2-bis(3-methyl-4-hydroxyphenyl)methane, 2,3,4,4'-tetrahydroxybenzophenone and 4,4'-[(4-hydroxyphenyl)methylene]bis[2-cyclohexyl-5-methylphenol]. Among these, resorcinol and 1,1-bis(4-hydroxyphenyl)cyclohexane are particularly preferred.

A content of the bivalent to hexavalent phenol compound is, to a total solid content in the photosensitive resin layer, preferably in the range of 0.5 to 20% by weight and more preferably in the range of 5 to 15% by weight.

Furthermore, in the positive photosensitive resin layer, from the viewpoints of enabling to recognize malfunctions such as transfer defects and precision defects during formation of the member for a display device to improve the productability, a decoloring dye may be added. The decoloring dye generally means a dye that is decolored by heating at 200° C. for 1 hr and a colored dye that is decolored during the baking. As the decoloring dye, one that is decolored by heating at 180° C. for 1 hr is preferred. Such a dye is usually a dye that is, upon heating, decomposed, or oxidized to cause a structural change, or vaporized or sublimated by heating. Furthermore, when a member for a display device is prepared by use of the decolorizing dye, the member for a display device is preferred, after the decolorization, to have the light transmittance of 90% or more to parallel light of 400 to 800 nm.

As the decoloring dyes, examples of the dyes that are decomposed by heating include dialkylaminotriphenylmethane-based dyes such as Victoria Pure Blue BOH, Victoria Pure Blue BOH-M, Malachite Green, Eisen Malachite Green and Malachite Green Hydrochloride. Examples of dyes that are vaporized or sublimated by heating include Orient Oil Brown, Methyl Yellow, Sumikaron Brilliant Blue B and 1,3,5-triphenyltetrazolium formazan.

As the decolorizing dyes, other than the above, ones that are described in Senryou Binran (Handbook of Dyes) edited by The Society of Synthetic Organic Chemistry, Japan, Maruzen Co., Ltd. (Jul. 20, 1972) and have 1 to 3 in the evaluation (under conditions of 180° C. and 1 hr or less) of the contamination resistance of the sublimation fastness test are used as well. Specific examples thereof include C.I. Disperse Yellow 8, 31 and 72, C.I. Disperse Orange 1, 3, 20 and 21, C.I. Disperse Red 15, 55, 60 and 65, C.I. Disperse Violet 8, 23, 26 and 37, C.I. Disperse Blue 20, 26, 55, 56, 72, 90, 91, 92 and 106, C.I. Disperse Black 29, Diacellition Direct Black B M/D (trade name, manufactured by Mitsubishi Chemical Co., Ltd.), Sumikaron Violet RS (trade name, manufactured by Sumitomo Chemical Co., Ltd.), Dianix Fast Sky Blue B MID (trade name, manufactured by Mitsubishi Chemical Co., Ltd.), Miketon Polyester Blue BCL and GRN (trade name, manufactured by Mitsui Petrochemical Co., Ltd.) and Kayaron Polyester Navy Blue GF (trade name, manufactured by Nippon Kayaku Co., Ltd.). Among these, when the aptitude of a heater and the environmental contamination are considered, as the decolorizing dye, a thermally-degradable dye is preferred.

An addition amount of the decolorizing dye is, to a total solid content of the positive photosensitive resin layer, preferably in the range of 0.1 to 10% by weight.

Furthermore, in the positive photosensitive resin layer, a thermoplastic binder may be used. As the thermoplastic binder, for instance, a compound having an ethylenically unsaturated bond or the like is cited.

An addition amount of the binder is appropriately selected in a range that does not damage an advantage of the invention.

To the positive photosensitive resin layer, an additive that may make a resin plastic may be added. Examples of the additives that may make the resin plastic include glycerin, ethylene glycol, propylene glycol, polyethylene glycol, alkyl phenol and tricresyl phosphate.

An addition amount of the additive that may make the resin plastic is, to a total resin amount, preferably in the range of 0 to 10% by weight and more preferably in the range of 1 to 8% by weight.

The positive photosensitive resin layer is formed by containing at least two kinds selected from a phenol novolak resin, a cresol novolak resin and a naphthoquinonediazide derivative, and preferably formed into a positive photosensitive transfer material where, when it is exposed in a desired pattern, the exposed portion is developed with an alkali aqueous solution or the like and removed. That is, to alkali-soluble phenol novolak resin and cresol novolak resin, a naphthoquinonediazide derivative works as a dissolution inhibitor. However, when the naphthoquinonediazide derivative is exposed to light, 3-indenecarboxylic acid is generated to lose the dissolution inhibiting function. Accordingly, the positive photosensitive resin layer that contains the cresol novolak resin and naphthoquinonediazide functions as a positive photoresist where only a light-exposed portion is dissolved by the alkali development.

A film thickness of the positive photosensitive resin layer is preferably in the range of 0.5 to 10 μm and more preferably in the range of 1 to 6 μm. When the film thickness is in the range of 0.5 to 10 μm, at the time when a positive photosensitive resin layer-coating solution is coated on a support, pinholes are formed with difficulty and, at the time of development, an exposed portion may be readily removed.

The positive photosensitive resin layer is formed by coating a positive photosensitive resin layer-coating solution where components contained in the positive photosensitive resin layer such as the phenol novolak resin, cresol novolak resin and naphthoquinonediazide derivative are dissolved in a solvent on a support (when a thermoplastic resin layer or an intermediate layer is formed between the support and the positive photosensitive resin layer, on the layer) by use of various kinds of coating means and dried.

The solvent that is used in the positive photosensitive resin layer-coating solution is, without particular restriction, appropriately selected according to the object. Examples thereof include alcohols such as methanol, ethanol, n-propanol, isopropanol, n-butanol, sec-butanol and n-hexanol; ketones such as acetone, methyl ethyl ketone, methyl isobutyl ketone, cyclohexanone and diisobutyl ketone; esters such as ethyl acetate, butyl acetate, n-amyl acetate, methyl sulfate, ethyl propionate, dimethyl phthalate, ethyl benzoate and methoxypropyl acetate; aromatic hydrocarbons such as toluene, xylene, benzene and ethyl benzene; halogenated hydrocarbons such as carbon tetrachloride, trichloroethylene, chloroform, 1,1,1-trichloroethane, methylene chloride and monochlorobenzene; ethers such as tetrahydrofuran, diethyl ether, ethylene glycol monomethyl ether, ethylene glycol monoethyl ether and 1-methoxy-2-propanol; dimethyl formamide, dimethylacetamide, dimethyl sulfoxide and sulfolane. These may be used singularly or in a combination of two or more kinds thereof. Among these, preferable examples thereof include methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptane, cyclohexane, ethyl carbitol acetate, butyl carbitol acetate and propylene glycol methyl ether acetate. These solvents may be used singularly or in a combination of two or more thereof.

<Negative Photosensitive Resin Layer>

The negative photosensitive resin layer is formed by containing at least a binder and furthermore contains a polymerizable monomer, a polymerization initiator, a constitutional pigment, and, as needs arise, an appropriately selected other component.

As the binder, although one developable by an alkali aqueous solution and one developable by an organic solvent are known, from the viewpoint of the pollution inhibition and securement of work safety, one that is developed by an alkali aqueous solution is preferred.

Among the binders, as ones that are used in the binder of the photosensitive resin layer involving the invention, a copolymer of (meth)acrylic acid and (meth)acrylic acid ester, a copolymer of styrene/maleic acid anhydride or a reaction products of a styrene/maleic acid anhydride copolymer and alcohols are cited, among these the copolymer of (meth) acrylic acid and (meth)acrylic acid ester being preferred.

As the (meth)acrylic acid-containing polymers, in general, polymers having a carboxylic acid group on a side chain such as a methacrylic acid copolymer, an acrylic acid copolymer, an itaconic acid copolymer, a crotonic acid copolymer, a maleic acid copolymer and a partially esterified maleic acid copolymer described in JP-A No. 59-44615, JP-B Nos. 54-34327, 58-12577 and 54-25957, JP-A Nos. 59-53836 and 59-71048 are cited. Furthermore, cellulose derivatives having a carboxylic acid group on a side chain as well are cited.

Other than the above, ones that are obtained by adding a cyclic acid anhydride to a polymer having a hydroxide group are preferably cited. In particular, a copolymer of benzyl (meth)acrylate and (meth)acrylic acid and a multiple copolymer of benzyl(meth)acrylate, (meth)acrylic acid and other monomer described in U.S. Pat. No. 4,139,391 are cited. Furthermore, alcohol-soluble nylon as well is cited.

Still furthermore, a plurality of (meth)acrylic acid-containing polymers may be combined and used.

The (meth)acrylic acid-containing copolymer is usually appropriately selected from ones that have the acid value in the range of 50 to 300 mgKOH/1 g and an weight average molecular weight in the range of 1,000 to 300,000 and used.

When the acid value is 50 mgKOH/1 g or more, a photosensitive resin layer is readily alkali developed. When the acid value is 300 mgKOH/1 g or less, a target structure is obtained.

The weight average molecular weight of the (meth)acrylic acid-containing polymer is, as mentioned above, preferably in the range of 1,000 to 300,000 and more preferably in the range of 10,000 to 250,000.

When the weight average molecular weight is 1,000 or more, a target structure is obtained. On the other hand, when the weight average molecular weight is 300,000 or less, a photosensitive resin layer is readily developed. Here, the weight average molecular weight is an average molecular weight based on polystyrene measured by GPC (gel permeation chromatography).

Furthermore, other than the binders mentioned above, a binder (high molecular weight material) containing a crosslinking group as well is used.

The high molecular weight material has a function, when resin structures such as spacers and colored pixels are formed, as a binder component, desirably has the polymerizability as the high molecular weight material per se, and preferably is a polymer resin having photopolymerizable allyl groups that are polymerized by light.

The high molecular weight material may be any one of a homopolymer of a monomer appropriately selected according to the object and a copolymer made of a plurality of monomers and may be used singularly or in a combination of two or more kinds thereof.

The monomer is, without particular restriction, appropriately selected according to the object. Examples thereof include alkyl(meth)acrylate, allyl(meth)acrylate, hydroxyalkyl(meth)acrylate, a vinyl compound and an ally group-containing (meth)acrylate. In the description, (meth)acrylate expresses acrylate or methacrylate.

The monomers may be used singularly or in a combination of two or more kinds thereof.

Preferable examples of the alkyl(meth)acrylates and allyl (meth)acrylates include methyl(meth)acrylate, ethyl(meth) acrylate, propyl(meth)acrylate, butyl(meth)acrylate, isobutyl (meth)acrylate, pentyl(meth)acrylate, hexyl(meth)acrylate, octyl(meth)acrylate, phenyl(meth)acrylate, benzyl acrylate, tolyl acrylate, naphthyl acrylate and cyclohexyl acrylate.

Examples of the hydroxyalkyl(meth)acrylates include hydroxymethyl(meth)acrylate, hydroxyethyl(meth)acrylate, hydroxypropyl(meth)acrylate, hydroxybutyl(meth)acrylate, hydroxyisobutyl(meth)acrylate, hydroxypentyl(meth)acrylate, hydroxyhexyl(meth)acrylate and hydroxyoctyl(meth) acrylate, among these, hydroxyethyl(meth)acrylate, hydroxy n-propyl(meth)acrylate and hydroxy n-butyl(meth)acrylate being preferred.

Preferable examples of the vinyl compounds include styrene, α-methylstyrene, vinyl toluene, glycidyl methacrylate, acrylonitrile, vinyl acetate, N-vinyl pyrolidone, tetrahydrofurfuryl methacrylate, polystyrene macromonomer and polymethyl methacrylate macromonomer.

Preferable examples of the allyl group-containing (meth) acrylates include allyl(meth)acrylate, 2-methylallyl acrylate, crotyl acrylate, chloroallyl acrylate, phenylallyl acrylate and cyanoallyl acrylate, among these, allyl(meth)acrylate being particularly preferred.

Among the high molecular weight materials mentioned above, resins at least having allyl group-containing (meth) acrylate as a monomer unit are preferred, and resins having allyl group-containing (meth)acrylate and a monomer selected from (meth)acrylic acid and allyl group-noncontaining (meth)acrylate as a monomer unit being more preferred.

Specific examples of preferable high molecular weight materials include a binary copolymer resin between (meth) acrylic acid ($M^1$) and allyl(meth)acrylate ($M^2$) [a preferable copolymerization ratio [mole ratio] is $M^1:M^2=2$ to 90:10 to 98] and a ternary copolymer resin between (meth)acrylic acid ($M^3$), allyl(meth)acrylate ($M^4$) and benzyl(meth)acrylate ($M^5$) [a preferable copolymerization ratio [mole ratio] is $M^3:M^4:M^5=5$ to 40:20 to 90:5 to 70].

A content of the allyl group-containing monomer when the high molecular weight material has an allyl group is preferred to be 10% by mole or more, preferably in the range of 10 to 100% by mole, more preferably in the range of 15 to 90% by mole and still more preferably in the range of 20 to 85% by mole.

A weight average molecular weight of the high molecular weight material is, based on polystyrene value measured by gel permeation chromatography (GPC), preferably in the range of 5,000 to 100,000 and more preferably in the range of 8,000 to 50,000. When the weight average molecular weight is set in the range of 5,000 to 100,000, the film strength is improved.

A content of the binder (high molecular weight material) in a photosensitive resin layer is, to a total solid content in the photosensitive resin layer, preferably in the range of 15 to 95% by weight, more preferably in the range of 30 to 85% by weight and still more preferably in the range of 40 to 75% by weight. When the content is 15% by weight or more, a film is readily formed at the coating.

<Polymerizable Monomer>

The polymerizable monomer, as far as it has at least one additionally polymerizable ethylenically unsaturated group, without particular restriction, is appropriately selected according to the object. Examples thereof include an ester compound, an amide compound and other compounds.

Examples of the ester compounds include monofunctional (meth)acrylic acid ester, multifunctional (meth)acrylic acid ester, itaconic acid ester, crotonic acid ester, isocrotonic acid ester, maleic acid ester and other ester compounds. These may be used singularly or in a combination of two or more kinds thereof. Among these, monofunctional (meth)acrylic acid ester, multifunctional (meth)acrylic acid ester and so on are preferred.

Examples of the monofunctional (meth)acrylic acid esters include polyethylene glycol mono(meth)acrylate, polypropylene glycol mono(meth)acrylate and phenoxyethyl mono (meth)acrylate.

Examples of multifunctional (meth)acrylic acid esters include polyethylene glycol di(meth)acrylate, ethylene glycol di(meth)acrylate, triethylene glycol di(meth)acrylate, 1,3-butanediol di(meth)acrylate, tetramethylene glycol di(meth)acrylate, hexanediol di(meth)acrylate, pentaerythritol tri(meth)acrylate, pentaerythritol tetra(meth)acrylate, dipentaerythritol di(meth)acrylate, dipentaerythritol tri (meth)acrylate, dipentaerythritol tetra(meth)acrylate, dipentaerythritol hexa(meth)acrylate, dipentaerythritol poly(meth)acrylate, sorbitol tri(meth)acrylate, sorbitol tetra(meth)acrylate, trimethylolethane tri(meth)acrylate, neopentyl glycol di(meth)acrylate and hexanediol di(meth)acrylate. Among these, dipentaerythritol poly(meth)acrylate is preferred.

Other examples of the multifunctional (meth)acrylic acid esters include ones obtained by adding ethylene oxide or propylene oxide to a multifunctional alcohol such as glycerin or trimethylolethane, followed by (meth)acrylating, urethane acrylates such as those described in JP-B Nos. 48-41708 and 50-6034 and JP-A No. 51-37193, polyester acrylates such as those described in JP-A No. 48-64183 and JP-B Nos. 49-43191 and 52-30490, epoxy acrylates that are reaction products of an epoxy resin and (meth)acrylic acid, (meth) acrylic acid ester, urethane (meth)acrylate and vinyl ester described in JP-A No. 60-258539.

Examples of the "other ester compounds" include trimethylolpropanetri(acryloyloxypropyl)ether, tri(acryloyloxyethyl)isocyanulate and photo-curable monomers and oligomers described in Nippon Secchaku Kyokaishi (Journal of The Adhesion Society of Japan), Vol. 20, No. 7, pages 300 to 308 (1984).

Furthermore, as the amide compounds, amide (monomer) of unsaturated carboxylic acid and an aliphatic polyvalent amine compound and so on are cited. Specific examples thereof include methylenebis-(meth)acrylamide, 1,6-hexamethylenebis-(meth)acrylamide, diethylenetriaminetris(meth) acrylamide and xylylenebis(meth)acrylamide and (meth) acrylic acid amide described in JP-A No. 60-258539.

Furthermore, as the "other compounds", for instance, allyl compounds described in JP-A No. 60-258539 are cited.

The polymerizable monomers may be used singularly or in a combination of two or more kinds thereof.

A content of the polymerizable monomer in the photosensitive resin layer is, to a total solid content of the layer, preferably in the range of 10 to 60% by weight and more preferably in the range of 20 to 50% by weight.

<Photopolymerization Initiator>

As the photopolymerization initiator, one that contains at least one kind of component that has the molar absorption coefficient of substantially 50 or more in a wavelength region of substantially 300 to 500 nm is preferred. Examples thereof include aromatic ketones, lophine dimmers, benzoin, benzoin ethers, poly-halogens, a halogenated hydrocarbon derivative, a ketone compound, a ketoxime compound, an organic peroxide, a thio compound, hexaarylbiimidazole, an aromatic onium salt and ketoxime ether described in JP-A 2-48664, JP-A 1-152449 and JP-A 2-153353.

Among these, a combination of 4,4'-bis(diethylamino)benzophenone and 2-(o-chlorophenyl)-4,5-diphenyl imidazole dimer, 4-[p-N,N'-di(ethoxycarbonylmethyl)-2,6-di(trichloromethyl)-s-triazine] and 2,4-bis-(trichloromethyl)-6-[4-(N, N'-diethoxycarbonylmethylamino)-3-bromophenyl]-s-triazine are preferred.

The photopolymerization initiators may be used singularly or in a combination of two or more kinds thereof.

A content of the photopolymerization initiator is, to an amount of the polymerizable monomer, preferably in the range of 0.1 to 20% by weight and more preferably in the range of 0.5 to 10% by weight.

When a black matrix is formed, the photosensitive resin layer is formed of a deep colored composition. Here, the deep colored composition is a composition that has a high optical density and a value thereof is in the range of 2.0 to 10.0. The optical density of the deep colored composition is, when the black matrix is formed, preferably in the range of 2.5 to 6.0 and particularly preferably in the range of 3.0 to 5.0. Furthermore, the deep colored composition is preferably cured in a photoinitiation system; accordingly, the optical density to an exposure wavelength (generally in UV-region) as well is important. That is, a value of the optical density to an exposure wavelength is in the range of 2.0 to 10.0, preferably in the range of 2.5 to 6.0 and most preferably in the range of 3.0 to 5.0. When the optical density is 2.0 or more, the black matrix may be formed into a desired shape. When the optical density is 10.0 or less, the polymerization is initialized and a partition wall is formed. As far as the deep colored composition has such the properties, a coloring agent in the composition may be an organic matter (various kinds of coloring matters such as dyes and pigments), carbons of various forms or ones made of a combination thereof. As such the coloring agent, there is no particular restriction. However, a black colored body is most frequently used.

In the invention, in the deep colored composition, an organic pigment, an inorganic pigment and a dye are preferably used. When the light shielding properties are necessary in the photosensitive resin layer, other than carbon black, powder of metal oxide such as titanium oxide or iron tetraoxide, powder of metal sulfide and powder of metal, a mixture of pigments of red, blue and green colors is used. Known coloring agents (dyes, pigments) may be used. When the pigment among the known coloring agents is used, the pigment is preferably evenly dispersed in the deep colored composition. Specific examples of preferable known coloring agents that are used in the invention include pigments and dyes described in paragraphs [0038] to [0054] in JP-A No. 2005-17716, pigments described in paragraphs [0068] to [0072] in JP-A No. 2004-361447 and coloring agents described in paragraphs [0080] to [0088] in JP-A No. 2005-17521.

A ratio of the deep colored body in the solid content of the deep colored composition is, from the viewpoint of sufficiently shortening a developing time, preferably in the range of 30 to 70% by weight, more preferably in the range of 40 to 60% by weight and still more preferably in the range of 50 to 55% by weight.

As the black coloring agent, carbon black, titanium carbon, iron oxide, titanium oxide and graphite are further exemplified. Among these, carbon black is preferred.

The pigment is preferably used as a dispersion. The dispersion is prepared by adding and dispersing a composition obtained by mixing in advance the pigment and a pigment dispersing agent to an organic solvent (or vehicle) described below. The vehicle means a portion of a medium in which the pigment is dispersed when a paint is in a liquid state and includes a portion (binder) that is a liquid and combines with the pigment to solidify a coated film and a component (organic solvent) that dissolves and dilutes the binder. A dispersing apparatus used to disperse the pigment is not particularly restricted. Examples of dispersing apparatus include known dispersing apparatus such as a kneader, roller mill, attritor, super mill, dissolver, homomixer and sand mill described in Kunizo Asakura, "Ganryo No Jiten, First Edition", p. 438 (2000), published by Asakura Shoten. Furthermore, the mechanical grinding by means of the friction force described in ibid. p. 310 may be used to dispersing a pigment.

The coloring agent (pigment) used in the invention has the number average particle diameter, from the viewpoint of the dispersion stability, preferably in the range of 0.001 to 0.1 μm and more preferably in the range of 0.01 to 0.08 μm. The "particle diameter" herein means a diameter when a particle in an electron microscope photograph is taken as a circle having an equal area and the "number average particle diameter" is obtained by measuring particle diameters of many particles, followed by averaging 100 particles thereof.

When a colored pixel is formed, the coloring agent used in the black matrix may be preferably used.

The photosensitive resin layer involving the invention may include, other than the high molecular weight material, polymerizable monomer and photopolymerization initiator, a coloring agent such as a dye and a pigment. Preferable kind and size of the pigments may be appropriately selected from the description of, for instance, JP-A No. 11-149008. When the coloring agent such as the pigment is contained in the photosensitive resin layer, a colored pixel may be formed.

Furthermore, as needs arise, an additive such as a surfactant may be added.

A layer thickness of a negative photosensitive resin layer is preferably in the range of 0.5 to 10 μm and more preferably in the range of 1 to 6 μm. When the layer thickness is in the range of 0.5 to 10 μm, at the formation of a coated film during production, pinholes are inhibited from occurring and, at the development, an unexposed portion is removed in a short time.

—Temporary Support—

A temporary support in the photosensitive transfer materials is preferred to be one having the peelability to the thermoplastic resin layer to an extent that does not disturb the transfer and appropriately selected from ones that are constituted from chemically and thermally stable and flexible materials. Specific preferable examples thereof include a thin sheet of Teflon (registered trademark), polyethylene terephthalate, polycarbonate, polyethylene, polypropylene and polyester or a laminate thereof.

A structure of the temporary support may be, without particular restriction, appropriately selected depending on the object and may be, for instance, a single layer structure or a laminate structure. These may be used singularly or in a combination of two or more kinds thereof.

The temporary support is, from the viewpoint of securing excellent peelability between the thermoplastic resin layer, preferred neither to apply surface treatment such as the glow discharge nor to dispose an undercoat layer such as gelatin.

A thickness of the temporary support is appropriately in the range of 5 to 300 μm and preferably in the range of 20 to 150 μm. When the thickness is in the range of 5 to 300 μm, the temporary support is inhibited from breaking when the temporary support is peeled and the resolution is inhibited from deteriorating at the exposure through the temporary support.

Among the specific examples, bi-axially stretched polyethylene terephthalate film is particularly preferred.

It is preferable that the temporary support has a conductive layer disposed at least on one surface thereof or the temporary support per se has the conductivity. In the case where the temporary support is constituted with the conductivity, when a photosensitive transfer material provided with the temporary support is intimately adhered on a transfer receiver, followed by peeling the temporary support, the temporary support and the transfer receiver are inhibited from charging to attract dust and so on in the neighborhood. As the result, even after the temporary support is peeled, the dust or the like does not adhere on the thermoplastic resin layer; accordingly, in a following exposure step, pinholes resulting from an extraneous unexposed portion are effectively inhibited from generating.

The surface electric resistance of a conductive layer on a temporary support or a surface of a temporary support having the conductivity is preferably $10^{13}\Omega$ or less.

In order to obtain a temporary support having the conductivity, a conductive material may be contained in the temporary support. The conductive material, without particular restriction, may be appropriately selected according to the object. For instance, metal oxides and antistatic agents are cited.

Examples of the metal oxides include zinc oxide, titanium oxide, tin oxide, aluminum oxide, indium oxide, silicon oxide, magnesium oxide, barium oxide and molybdenum oxide. These may be used singularly or in a combination of two or more kinds thereof. Furthermore, as the form of the metal oxide, crystalline fine particles, composite fine particles and so on are cited.

Examples of the antistatic agents include alkyl phosphate-based anionic surfactants such as Electrostripper A (trade name, manufactured by Kao Corp.) and Elenon No. 19 (trade name, manufactured by Dai-ichi Kogyo Seiyaku Co., Ltd.); betaine-based amphoteric surfactants such as Amogen K (trade name, manufactured by Dai-ichi Kogyo Seiyaku Co., Ltd.); polyoxyethylene fatty acid ester-based nonionic surfactants such as Nissan Nonion L (trade name, manufactured by Nippon Oil and Fat Co., Ltd.); polyoxyethylene alkyl ether-based nonionic surfactants such as Emulgen 106, 120, 147, 420, 220, 905 and 910 (trade name, manufactured by Kao Corp) and Nissan Nonion E (trade name, manufactured by Nippon Oil and Fat Co., Ltd.); and other nonionic surfactants such as polyoxyethylenealkylphenol ether-based surfactants, polyvalent alcohol fatty acid ester-based surfactants, polyoxyethylenesorbitan fatty acid ester-based surfactants and polyoxyethylenealkylamine-based surfactants. These may be used singularly or in a combination of two or more kinds thereof.

The conductive layer is formed by appropriately selecting among the known conductive materials to use. Preferable examples of the conductive materials include $ZnO$, $TiO_2$, $SnO_2$, $Al_2O_3$, $In_2O_3$, $SiO_2$, $MgO$, $BaO$ and $MoO_3$. These are preferred because these exert stable conductive effect without being affected by humidity environment. These may be used singularly or in a combination of two or more kinds thereof.

A value of the volume resistance of the metal oxide or conductive material is preferably $10^7 \Omega \cdot cm$ or less and more preferably $10^5 \Omega \cdot cm$ or less.

Furthermore, a particle diameter of the metal oxide or conductive material is preferably in the range of 0.01 to 0.7 μm and more preferably in the range of 0.02 to 0.5 μm.

In the conductive layer, as the binder, for instance, cellulose esters such as gelatin, cellulose nitrate, cellulose triacetate, cellulose diacetate, cellulose acetate butyrate and cellulose acetate propionate, homopolymers or copolymers containing vinylidene chloride, vinyl chloride, styrene, acrylonitrile, vinyl acetate, alkyl acrylates having 1 to 4 carbon atoms and vinyl pyrolidone, soluble polyester, polycarbonate and soluble polyamide may be used.

—Other Layers—

In the photosensitive transfer material of the invention, other than the above-mentioned layers, other layers such as a cover film may be disposed.

The cover film has a function of protecting the photosensitive resin layer from contamination and damage during storage and is constituted of a material same or similar to the temporary support. The cover film may be any one as far as it is readily peeled off the photosensitive resin layer. Preferable examples thereof include silicone sheet, polyolefin sheet and polytetrafluoroethylene sheet. Among these, the polyethylene sheet or film, or polypropylene sheet or film is preferred.

A thickness of the cover film is preferably substantially in the range of 5 to 100 μm and more preferably in the range of 10 to 30 μm.

A photosensitive transfer material of the invention may be produced in such a manner that, on a temporary support, a thermoplastic resin layer-coating solution constituted alkali-soluble is coated and dried to dispose an alkali-soluble thermoplastic resin layer, on the thermoplastic resin layer, an intermediate layer-coating solution that uses an aqueous solvent that does not dissolve the thermoplastic resin layer is coated and dried to dispose an intermediate layer, and furthermore, on the intermediate layer, a photosensitive resin layer-coating solution that uses a solvent that does not dissolve the intermediate layer is coated and dried to dispose a photosensitive resin layer. Furthermore, as another process, a photosensitive transfer material is produced in such a manner that one where a photosensitive resin layer is disposed on a cover film and one where, on a temporary support, an alkali-soluble thermoplastic resin layer and an intermediate layer are disposed in this order from the support side are prepared, and a surface of the former photosensitive resin layer and a surface of the latter intermediate layer are adhered so as to come into contact with each other. Alternatively, as still another process, a photosensitive transfer material may be produced in such a manner that one where, on a cover film, a photosensitive resin layer and an intermediate layer are disposed in this order from the cover film side and one where, on a temporary support, an alkali-soluble thermoplastic resin layer is disposed are prepared, followed by adhering so that a surface of the former intermediate layer and a surface of the latter thermoplastic resin layer may come into contact with each other.

(Substrate)

In the invention, as a substrate on which a color filter is formed, for instance, a transparent substrate is used. Examples of the transparent substrates include known glass sheets such as a soda glass sheet having a silicon oxide film on the surface, low expansion glass, non-alkali glass and quartz glass, or a plastic film.

Furthermore, the substrate, when it is coupling treated in advance, may improve the adhesiveness with a colored resin composition or a resin transfer material. As the coupling treatment, a process described in JP-A No. 2000-39033 is preferably used. Though not particularly restricted, a film thickness of the substrate is generally preferable to be in the range of 700 to 1200 μm.

The photosensitive transfer material of the invention is preferably used when a spacer (gap holding member) for holding a predetermined gap between a pair of substrates that constitute a liquid crystal display device is formed, when a liquid crystal orientation-controlling projection is formed and, when, in the case where a coloring agent is contained, a colored image (colored pixel and black matrix) is formed.

In this case, as a transfer receiver, a transparent substrate (such as glass substrate and plastic substrate) that constitute a liquid crystal display device, a substrate provided with a transparent conductive film (such as ITO film), a substrate provided with a color filter and a driving substrate provided with a driving element (such as thin film transistor [TFT]) are cited.

In the next place, method for forming constituent members (members for a display device) of a liquid crystal display device that uses a photosensitive transfer material of the invention, that is, a method for producing members for a display device of the invention will be described.

—Transfer—

After the cover film is removed from the photosensitive transfer material of the invention, which was prepared as mentioned above, an exposed photosensitive resin layer is adhered under pressure and heating on a desired transfer receiver (laminate). The lamination is preferably carried out by use of a known laminator or a vacuum laminator. From the viewpoint of more improving the productivity, a laminator provided with an auto-cut mechanism, an intelligent laminator that automatically detect defects of the photosensitive transfer material to skip to laminate a sound portion and a large-scale laminator that is able to laminate a roll of a wider photosensitive transfer material may be preferably used.

Corresponding to a large size liquid crystal panel or plasma display, a substrate size is becoming larger; accordingly, in a large substrate, a transfer area of the photosensitive transfer material is expanded in a width direction (a direction intersecting with a conveying direction) and a dimension in a width direction of the photosensitive transfer material per se has to be increased.

In a wide photosensitive transfer material, there are problems in that handling property in a roll state is deteriorated and a delivery mechanism for rewinding the photosensitive transfer material from the roll becomes large. Furthermore, there is another problem in that, since a wide photosensitive transfer material is very heavy, handling is troublesome. Still furthermore, there is still another problem in that, since, owing to the deflection caused by weight in a width direction of the photosensitive transfer material, wrinkles tend to be generated in a plane, and, during lamination, air bubbles are caught up to deteriorate the display performance. Accordingly, a laminator that may laminate two or more rolls of the photosensitive transfer material on one large substrate may be particularly preferably used.

As the preferable laminator for use in large substrates, one that includes: two or more web delivery mechanisms capable of simultaneously delivering long photosensitive transfer materials where a photosensitive resin layer and a protective film are sequentially laminated on a support; two or more working mechanisms for forming a working site cutable in a width direction corresponding to a boundary position of a peeling portion and a remaining portion to the protective film of the delivered respective long photosensitive transfer materials; two or more peeling mechanisms for peeling the peeling portion off each of the long photosensitive transfer materials with the remaining portion remained; a substrate conveyer mechanism for conveying a substrate heated at a predetermined temperature to a joining position; a joining mechanism for, at the joining position, disposing each of the remaining portions between the substrate and joining integrally and in parallel two or more photosensitive material layers exposed by peeling each of the peeling portions on the substrate to obtain a joined substrate; two or more detection mechanisms disposed in the proximity of the joining position to directly detect the boundary position of each of the long photosensitive webs or to detect a marked portion disposed on each of the long photosensitive webs corresponding to the boundary position; and a control mechanism capable of controlling, based on positional information of the respective boundaries detected by the respective detection mechanisms, relative positions of the respective boundary positions and the substrate in the joining position and relative positions of the respective boundary positions is cited. See (JP-A No. 2004-333647), [A Production Process of Large Size Liquid Crystal Color Filter due to Transfer System] (Challenging for Extremity-1: "Challenging for Nano-size, Challenging for Macro-size"), Aug. 27, 2004, Sponsored by Society of Chemical Engineers, Japan).

When the large-scale laminator is used, two or more photosensitive transfer materials are excellently transferred in a width direction to a wide substrate and high quality photosensitive resin layers may be efficiently obtained. Furthermore, since a long photosensitive transfer material is not necessarily constituted wide in the width, the handling property of the long photosensitive transfer material is effectively improved and high efficiency of the operation and reduction of the equipment expenditure are preferably attained.

When, for instance, a spacer is formed, for instance, a cover film of a photosensitive transfer material of the invention is removed, an exposed photosensitive resin layer is laminated to adhere to a transfer receiver, and a temporary support is peeled at and removed of an interface with a thermoplastic resin layer to transfer on a transfer receiver. Thereafter, the photosensitive resin layer is exposed through a predetermined mask via a thermoplastic resin layer and an intermediate layer, followed by developing and removing a non-exposed portion of the photosensitive resin layer in the case of negative photosensitive resin layer or an exposed portion in the case of positive photosensitive resin layer by use of an alkali aqueous solution, further followed by curing only exposed portion or non-exposed portion to form a spacer.

Furthermore, in order to simplify an equipment and reduce the cost and space, from the viewpoint of improving the productivity, a laminator provided with a peeling mechanism that continuously peels a cover film and a temporary support is preferably used. As an example of a laminator provided with a peeling mechanism, a laminator described in JP-A 2004-333616 is preferably cited.

—Exposure—

A process where a predetermined mask is disposed above a photosensitive resin layer formed on the substrate, followed by exposing from above the mask through the mask, a thermoplastic resin layer and an intermediate layer, further followed by developing with a developing solution is repeated by the number of colors, thereby, a color filter of the invention may be obtained.

Here, a light source at the exposure, as far as it may illuminate light (such as 365 nm, 405 nm or the like) in a wavelength region capable of curing a resin layer, is appropriately selected and used. Specifically, an ultrahigh pressure mercury lamp, a high pressure mercury lamp, a metal halide lamp and so on are cited. An exposure amount is usually substantially in the range of 5 to 200 mJ/cm$^2$ and preferably substantially in the range of 10 to 100 mJ/cm$^2$. For instance, a proximity exposure unit (manufactured by Hitachi High-Tec Engineering Ltd.) provided with an ultrahigh pressure mercury lamp is used and an exposure amount may be appropriately selected (such as 300 mJ/cm$^2$).

—Development—

The development is carried out according to a known alkali development process. For instance, by use of a solvent or aqueous development solution, in particular, an alkali aqueous solution (alkali developing solution), an exposed transfer receiver is dipped in a development bath that accommodates a development solution or a layer on a transfer receiver is sprayed by use of a sprayer, followed by rubbing a surface thereof with a rotary brush or a wet sponge or irradiating ultrasonic to treat. A development temperature is usually preferred to be in the range of around room temperature to 40° C. Furthermore, after the development, water washing is preferably applied.

In the step of development and removing an unnecessary portion after the exposure, as an alkali aqueous solution that is used to dissolve the photosensitive resin layer and the thermoplastic resin layer, for instance, a thin aqueous solution of an alkaline material is preferred and one to which a slight amount of a water-miscible organic solvent is added is preferred as well.

The alkaline material is, without particular restriction, may be appropriately selected according to the object. Examples thereof include alkali metal hydroxides such as sodium hydroxide and potassium hydroxide; alkali metal carbonates such as sodium carbonate and potassium carbonate; alkali metal hydrogen carbonates such as sodium hydrogen carbonate and potassium hydrogen carbonate; alkali metal silicates such as sodium silicate and potassium silicate; alkali metal metasilicates such as sodium metasilicate and potassium metasilicate; tetraalkylammonium hydroxides such as triethanol amine, diethanol amine, monoethanol amine, morpholine and tetramethylammonium hydroxide and trisodium phosphate. These may be used singularly or in a combination of two or more kinds thereof.

In the alkaline aqueous solution, a concentration of an alkaline material is preferably in the range of 0.01 to 30% by weight and the pH thereof is preferably in the range of 8 to 14.

The water-miscible organic solvent is not particularly restricted and appropriately selected according to the object. Examples thereof include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethyl formamide, dimethyl acetamide, hexamethyl phosphoramide, ethyl lactate, methyl lactate, ε-caprolactone and N-methylpyrolidone.

An addition amount of the water-miscible organic solvent is preferably in the range of 0.1 to 30% by weight.

To the alkaline aqueous solution, various kinds of known surfactants may be added. An addition amount when the surfactant is added is preferably in the range of 0.01 to 10% by weight.

As the development process, known processes such as a paddle development, a shower development, a shower and spin development and a dip development may be used.

Here, the shower development will be described. When a development solution is sprayed by a shower to an exposed resin layer, an uncured portion may be removed. It is preferred that, prior to the development, an alkaline solution low in the solubility of the resin layer is sprayed by a shower to remove a thermoplastic resin layer and an intermediate layer. Furthermore, it is preferred that, after the development, a cleaning agent is sprayed by a shower while rubbing with a brush to remove the development residue.

As the cleaning solution, known ones may be used. "T-SD1" (trade name, manufactured by Fuji Photo Film Co., Ltd., containing phosphate, silicate, nonionic surfactant, defoaming agent, stabilizer) or "T-SD2" (trade name, manufactured by Fuji Photo Film Co., Ltd., containing sodium carbonate, phenoxyoxyethylene-based surfactant) are preferred.

In a development tank, a roller conveyer is disposed and a substrate is horizontally conveyed. In order to inhibit the roller conveyer from being bruised, a photosensitive resin is preferably formed on a top surface of the substrate. In the case where a substrate size exceeds 1 m, when the substrate is horizontally conveyed, in the proximity of a substrate center, a development solution stays, and, thereby, difference of development between the substrate center and a periphery portion becomes problematic. In order to avoid this, the substrate is desirably obliquely tilted. A tilt angle is set preferably in the range of 5 to 30°.

Furthermore, when pure water is sprayed before the development to wet a photosensitive resin layer, homogeneous development is preferably attained.

Still furthermore, when, after the development, air is lightly sprayed to the substrate to substantially remove excessive solution, followed by applying shower washing, more homogeneous development results. Furthermore, when, prior to the water washing, ultra pure water is sprayed from an ultrahigh pressure cleaning nozzle under pressure of 3 to 10 MPa to remove the residue, a high quality image free from the residue may be obtained. When the substrate is conveyed with water drops adhered thereon to a latter step, a process is contaminated or stains remain on the substrate; accordingly, it is preferred to drain water by use of an air knife to remove extraneous water and water droplets.

—Post Exposure—

From the viewpoints of controlling a sectional shape of an image, controlling the hardness of an image, controlling the surface unevenness of an image and controlling the film reduction of an image, between the development and heat treatment, post exposure is preferably applied. Examples of light sources that are used in the post exposure include an ultrahigh pressure mercury lamp, a high pressure mercury lamp and a metal halide lamp described in paragraph 0074 of JP-A No. 2005-3861. In the post exposure, from the viewpoint of simplification of the equipment and the power saving, light from a light source such as an ultrahigh pressure mercury lamp or a metal halide lamp is preferably directly illuminated to a substrate without interposing an exposure mask or the like. As needs arise, the post exposure is applied from both surfaces. An amount of exposure is also appropriately controlled according to the control object in the range of 100 to 2000 mJ/cm$^2$ in a top surface and in the range of 100 to 2000 mJ/cm$^2$ in a bottom face.

—Heat Treatment—

When the heat treatment is applied, monomers and a crosslinking agent contained in a photosensitive resin layer of a photosensitive transfer material of the invention are reacted to enable to secure the hardness of an image. A heat treatment temperature is preferably set in the range of 150 to 250° C. When the heat treatment temperature is set at 150° C. or more, sufficient hardness of an image is obtained. When the heat treatment temperature is 250° C. or less, the color purity is difficult to deteriorate owing to coloration of a resin. A heat treatment time is preferably set in the range of 10 to 150 min. When the heat treatment time is set at 10 min or more, sufficient hardness of an image is obtained. When the heat treatment time is 150 min or less, the color purity is difficult to deteriorate owing to coloration of a resin. Furthermore, the heat treatment may be varied depending on colors. Still furthermore, after all colors are formed, a final heat treatment may be further applied to stabilize the hardness. At that case, a little higher temperature (such as 240° C.) is preferable from the viewpoint of the hardness.

—Member for Display Device—

Members for a display device of the invention are produced by method for producing a member for a display device of the invention.

The members for a display device, without particular restriction, may be appropriately selected according to the object. At least any one of a spacer (pillar), a liquid crystal orientation-controlling projection, a black matrix, a colored pixel and a stacked pillar is preferred.

The spacer (pillar) is, as far as it enables to maintain a thickness of a liquid crystal layer in a liquid crystal display device constant, without particular restriction on a shape, a magnitude and number, appropriately selected according to the object.

A shape of the spacer, that is, a shape of a cross section when the spacer is cut by a plane in parallel with a substrate, without particular restriction, may be appropriately selected according to the object. For instance, a circle, an ellipse, a polygon having round corners, a cross, a T-character shape or an L-character shape is preferred. Furthermore, when a spacer is formed by lamination, a shape of each of the layers is, without particular restriction, preferred to be a circle, an ellipse, a polygon having round corners, a cross, a T-character shape or an L-character shape, these being arbitrarily laminated to form a spacer.

A magnitude (height) of the spacer is, for instance, preferably in the range of 1 to 9 μm and more preferably in the range of 2 to 8 μm. When the height of the spacer is 1 μm or more, a sufficient cell gap is secured. When the height is 9 μm or less, since a cell gap of a liquid crystal display device is appropriate, a voltage necessary for driving a liquid crystal display device may be set low.

From the viewpoints of improving the in-screen uniformity of a gap between two substrates for a liquid crystal display device, which are held by spacers, the spacers are preferably formed in non-display areas inside of a screen and outside of the screen. However, in some cases, the spacer may be disposed on any one of the non-display portions inside of a screen and outside of the screen.

An area per spacer and a disposition place are largely affected by a structure of a display device. In a color filter having fixed dot-shaped spacers, from the restriction on an area of a non-display region in one pixel, an area per spacer within a screen is preferably in the range of 10 to 1,000 μm$^2$ and more preferably in the range of 10 to 250 μm$^2$. The spacer area here means an area of a portion that is the uppermost portion of a spacer formed on a conductive layer and comes into contact with a counter substrate or an area of a portion that comes into contact with a spacer prepared on a counter substrate when a display device is prepared.

As the liquid crystal orientation-controlling projection (in some cases, called as a projection or an orientation-controlling projection), one that may control a direction of orientation of a liquid crystal molecule is preferred, and, as far as it is formed inside (between the conductive layer and the liquid crystal layer) of a conductive layer of a display device, a shape and form thereof are not particularly restricted. As the shape, for instance, a pyramid (three-sided pyramid, four-sided pyramid and so on) with a substrate surface (or color filter surface) as a bottom face, a hemisphere, a cone with a substrate surface (or color filter surface) as a bottom face, a trapezoid and a barrel, a triangle prism formed in band on a substrate (on a color filter) and having a triangular sectional shape that is orthogonal to a length direction, and pillars having a sectional shape orthogonal to a length direction such as a hemi-circle, a square, a trapezoid and a barrel and so on may be used.

The disposition aspect of the liquid crystal orientation-controlling projections is appropriately selected from known aspects and aspects described in Japanese Patent No. 2947350 may be adopted. For instance, an aspect where a plurality of pillars formed in band on a substrate and having a trapezoidal sectional shape orthogonal to a length direction is disposed in a pattern extended in parallel in one direction at equi-pitch and on the respective conductive layers (electrodes) of two substrates may be adopted (see FIG. 14 of Japanese Patent No. 2947350). When the liquid crystal orientation-controlling projections are disposed on conductive layers (electrodes) of both substrates, structures having the same shape are not necessarily formed and structures having different shapes may be formed in combination. Furthermore, the structure formed in band on the substrate (or color filter) is not restricted to a linear mode and may be disposed in a winding mode with a predetermined angle (see FIGS. 42 and 55 of Japanese Patent No. 2947350).

Other than the above, details of a magnitude, a disposition distance and a disposition shape are referred to Japanese Patent No. 2947350.

Among the shapes of the liquid crystal orientation-controlling projection, from the viewpoint of being able to obtain a sufficient visual field angle, a liquid crystal orientation-controlling projection having any one of shapes of a trapezoid or a barrel in a cross section orthogonal to the substrate is preferred, a trapezoid having the substrate surface (or color filter surface) as a bottom face, or barrel, or pillars formed in band on a substrate (color filter) and having a hemi-circle, a trapezoid or a barrel in a cross section orthogonal to a length direction thereof being preferred.

As mentioned above, when the liquid crystal orientation-controlling projections are disposed inside of the conductive layer (between the conductive layer and liquid crystal layer) so as to be convex toward a liquid crystal layer side, a direction of orientation of liquid crystal molecules are controlled so as to tilt along a convex surface of the liquid crystal orientation-controlling projection; accordingly, without depending on a position (visual field angle) observing a liquid crystal surface, a wide visual field angle is secured.

The colored pixels are red, green and blue pixels constituting a color filter.

In the invention, the contrast of the colored pixels may attain high contrast when particle size of the dispersed pigment is finely particulated.

The contrasts of the respective pixels are preferably 2000 or more, more preferably 2800 or more, still more preferably 3000 or more and most preferably 3400 or more. Furthermore, the difference of the contrasts of the respective colored pixels is 600 or less, preferably 410 or less, more preferably 350 or less and most preferably 200 or less. In the case where the contrasts of the respective colored pixels that constitute a color filter are less than 2000, when an image of a liquid crystal display device having the contrast is observed, a whitish image is obtained as a whole to be unfavorably difficult to see. Furthermore, when the difference of the contrasts of the respective colored pixels exceeds 600, amounts of light leakage from the respective colored pixels during black display are largely different; accordingly, even when color adjustment is applied based on the respective color characteristics during white display of the panel, during black display, a color balance collapses to be unfavorably poor in the color reproduction.

In the invention, the contrast of the colored pixel means the contrast evaluated for individual colors of R(red), G(green) and B(blue) that constitute a color filter.

A measurement process of the contrast is as follows. On each of both sides of an object to be measured, a polarizing plate is superposed, with polarization directions of the polarization plates disposed in parallel to each other, from a side of one polarization plate, a backlight is illuminated to measure brightness Y1 of light transmitted through the other polarization plate. In the next place, with the polarization plates disposed orthogonal to each other, from a side of one polarization plate, a backlight is illuminated to measure brightness Y2 of light transmitted through the other polarization plate. With obtained measurement values, the contrast is calculated as Y1/Y2. Here, as the polarization plate, G1220DUN (trade name, manufactured by Nitto Denko K. K.) is used and, as a measuring apparatus, a color brightness meter BM-5 (trade name, manufactured by Topcon K. K.) is used. The polarization plate used in the contrast measurement is one same as a polarization plate that is used in a liquid crystal display device that uses the color filter.

When a particle diameter of a pigment is finely particulated, a dispersion time of a pigment dispersion is controlled to attain. When the pigment is dispersed, above-described known dispersing apparatus may be used. A dispersion time is in the range of 10 to 35 hr, preferably in the range of 10 to 30 hr, more preferably in the range of 18 to 30 hr and most preferably in the range of 24 to 30 hr. When the dispersion time is 10 hr or more, the particle diameter of the pigment may be made small. Accordingly, the polarization is not cancelled due to the pigment and thereby the contrast is improved. On the other hand, when the dispersion time is 35 hr or less, since the viscosity of the dispersion does not go up, the coating is readily carried out.

The black matrix demarcates two or more pixel groups and is generally black without restricting thereto. A coloring material that forms a deep color is preferred to be an organic material (various kinds of coloring materials such as dyes and pigments).

When, in the invention, a colored pixel is formed by use of an inkjet process, a height of the black matrix is preferably 1.0 µm or more, more preferably 1.5 µm or more and 10 µm or less, still more preferably 1.8 µm or more and 7.0 µm or less and particularly preferably 2.0 µm or more and 5.0 µm or less. Among these, when the height is set at 1.5 µm or more and 10 µm or less, the color mixture is more effectively inhibited from occurring. When the height is less than 1.5 µm, the color mixture tends to occur. On the other hand, when the height exceeds 10 µm, the black matrix is formed with difficulty.

Furthermore, the optical density at 555 nm of the black matrix is preferably 2.5 or more, more preferably in the range of 2.5 to 10.0, still more preferably in the range of 2.5 to 6.0 and particularly preferably in the range of 3.0 to 5.0.

When the optical density is set in the range, a display device high in the contrast is preferably obtained. Furthermore, from the viewpoint of the display quality of the display device, a color of a deep colored partition wall is preferred to be black.

The stacked pillar means a structure where a spacer, a liquid crystal orientation-controlling projection and a colored layer of a color filter are stacked. For instance, the dot-shaped spacer is constituted from one layer, two layers or three layers of colored layers. For instance, when, on a substrate on which a black matrix is formed, a colored layer of a first color is used to form a pattern of a colored layer of a desired first color, a colored layer is remained in a portion that covers an opening portion of the black matrix and a portion where colored layers are laminated to form a spacer. Similar operations are repeated for second and third colors to form one layer of colored layer on the opening portion of the black matrix. Furthermore, in order to secure a sufficient cell gap as a spacer, it is preferred to stack two or three layers of the colored layers on a spacer-forming position.

From the viewpoints of not reducing an area of a display portion and securing a sufficient cell gap, it is preferred to constitute a spacer by stacking a colored layer by one layer, two layers or three layers on a black matrix that is a non-display region. However, in the case where a spacer may have a height same as that of a partition and orientation projection, that is, in the case where, even when a black matrix thicker than a colored layer is disposed under a dot-shaped spacer, and a dot-shaped spacer and a partition and orientation projection are formed simultaneously, the partition and orientation projection does not come into contact with a counter electrode substrate due to a height of the spacer becoming larger, a colored layer may not be disposed on a spacer position. That is, in this case, the spacer is made of one layer same as that of the partition orientation projection.

The process for forming the stacked column, without particular restriction, may be appropriately selected according to the object. For instance, as shown in FIG. 1 of JP-A No. 11-248921, on alkali-free glass 1, a black matrix 2 is formed with a black paste. A blue colored layer 3 is formed so as to bury an opening portion of the black matrix 2 and, simultaneously, the blue colored layer 4 is disposed on a spacer-forming position on the black matrix. Similarly, a red colored layer is formed on an opening portion 7 and on a spacer-forming position 6 of the black matrix. Then, a green colored layer is formed on an opening portion 5 and on a spacer-forming position 8 of the black matrix. In the next place, a transparent protective layer 9 is formed, followed by further stacking a transparent conductive layer 10. On the transparent conductive layer 10, a partition and orientation projection (liquid crystal orientation-controlling projection) 11 and a dot-shaped spacer 12 are simultaneously formed. Thereby, a stacked column is formed.

—Formation of Respective Pixels by Applying Liquid Droplet—

To a gap of the black matrix formed in the development step, each of colored liquid compositions for forming the respective pixels of RGB is made intrude to the gap. As a process where the colored liquid composition is made intrude in a demarcation wall gap, known processes such as an inkjet process and an extrusion dye coating process may be used, the inkjet process being preferred from the viewpoint of the cost. Furthermore, before the respective pixels are thus formed, a shape of the black matrix may be fixed and, as means thereof, what are mentioned below are cited without particularly restricting. That is, (1) after development, re-exposure is carried out (in some cases, referred to as post exposure) and (2) after development, a heat treatment is applied at a relatively low temperature. The heat treatment here indicates to heat a substrate having a black matrix in an electric furnace or a drier or to illuminate an infrared lamp.

Here, an exposure amount when the (1) is carried out is, under an air atmosphere, in the range of 500 to 3000 mJ/cm$^2$ and preferably in the range of 1000 to 2000 mL/cm$^2$, and under a oxygen deficient atmosphere, an exposure at an amount lower than that is possible. Furthermore, when the (2) is carried out, a heating temperature is set in the range of 50 to 120° C. and preferably substantially in the range of 70 to 100° C., and a heating time is substantially in the range of 10 to 40 min. When a temperature is 50° C. or more, the black matrix is forwarded in curing. Furthermore, when the temperature is set at 120° C. or less, there is no fear in that a shape of the black matrix may collapse.

As to an inkjet process that is used to form the respective pixels, known processes such as a process where ink is thermally cured, a process where ink is optically cured and a process where, after a transparent image receiving layer is formed on a substrate in advance, an ink droplet is applied may be used.

Preferably, after the respective pixels are formed, a heating step for carrying out heat treatment (so-called baking treatment) is disposed. That is, a substrate having a layer photopolymerized by light illumination is heated in an electric furnace, a drier or the like or illuminated by an infrared lamp. A heating temperature and time are, though depending on a photosensitive deep-colored composition and a thickness of a formed layer, generally from the viewpoints of obtaining sufficient solvent resistance, alkali resistance and UV-absorbance, are preferably substantially in the ranges of 120 to 250° C. and substantially 10 to 120 min.

Figure 1B:
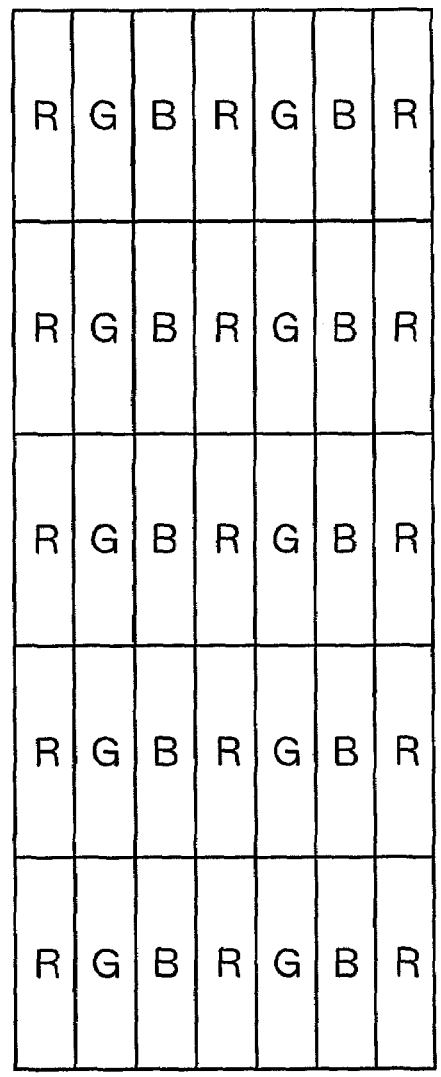
FIG. 1B is a diagram showing a pattern (lattice structure or stripe structure) of a color filter.

A pattern shape of thus formed color filter, without particularly restricting, may be a stripe shape that are general black matrix shape and a lattice shape (see FIG. 1B) and a delta-arranged shape (see FIG. 1A).

(Inkjet Process)

As an inkjet process that is used in the invention, various processes such as a process where charged ink is continuously ejected and an electric field is used to control, a process where a piezoelectric device is used to intermittently eject ink and a process where ink is heated and, by making use of the bubbling, the ink is intermittently ejected are adopted.

The ink that is used may be oil-based ink or water-based ink. Furthermore, a coloring agent contained in the ink may be a dye or a pigment. However, from the viewpoint of the endurance, the pigment is preferably used. Still furthermore, colored ink in a coating process (colored resin compositions such as described in paragraphs [0034] to [0063] in JP-A No. 2005-3861) and inkjet compositions described in paragraphs [0009] to [0026] of JP-A No. 10-195358, which are used in known processes for preparing a color filter, may be used as well.

In the ink in the invention, considering a step after coloring, a component that is cured upon heating or by an energy line such as UV-ray may be added. As the component that is cured upon heating, various kinds of thermosetting resins are in wide use and, as the component that is cured by an energy line, for instance, one obtained by adding a photopolymerization initiator to an acrylate derivative or a methacrylate derivative are exemplified. In particular, from the viewpoint of the heat resistance, ones having a plurality of acryloyl groups or methacryloyl groups in a molecule are more preferred. Water-soluble acrylate derivatives and methacrylate derivatives may be preferably used and even water-insoluble ones may be used by emulsifying.

In this case, the photosensitive resin compositions in which a coloring agent such as a pigment is added, which was cited in a section of the <Deep-colored Composition>, are preferably used.

Furthermore, as the ink that may be used in the invention, also thermosetting ink for color filters, which contains at least a binder and a bifunctional to trifunctional epoxy group-containing monomer, may be preferably used.

A color filter of the invention is preferably a color filter in which pixels are formed according to the inkjet process. It is preferred that ink of each of three colors of RGB is ejected to form a color filter of three colors.

The color filter is combined with a liquid crystal display element, an electrophoretic display element, an electrochromic display element, a PLZT or the like and used as a display element. The color filter is used as well in applications where a color filter is used such as color camera and so on.

(Water-Repelling Treatment)

In the invention, in the case where colored pixels are formed by a droplet applying process, it is preferred that a water-repelling treatment is applied to the black matrix to render the black matrix at least partially water-repellent. This is because, when, after the black matrix is formed, a process such as inkjet process is used to apply droplets of a colored liquid composition (the active energy line-curable inkjet ink) between the black matrices, the ink is inhibited from causing inconveniences such as overrunning the black matrix to cause the color mixture with adjacent colors.

As the water-repelling treatment, a process where a water-repelling material is coated on a top surface of the black matrix (such as JP-A No. 10-123500), a process where a water-repelling layer is disposed anew (such as JP-A No. 05-241011), a process where plasma treatment is applied to impart the water-repellency (such as JP-A No. 2002-62420), a process where a water-repelling material is kneaded in the black matrix (such as JP-A No. 2005-36160) and so on are cited.

(Overcoat Layer)

After the color filter is prepared, in some cases, in order to improve the resistance, an overcoat layer is disposed over an entire surface. The overcoat layer enables to protect solid layers of ink R, G and B and to make a surface flat. However, from the viewpoint of increasing the number of steps, it is better not to dispose.

As a resin (OC agent) that forms an overcoat layer, an acrylic resin composition, an epoxy resin composition, a polyimide resin composition and so on are cited. Among these, from the viewpoints of being excellent in the transparency in a visible light region and, since a resin component of a photo-curing composition for color filters is usually mainly formed of an acrylic resin, being excellent in the adhesiveness, an acrylic resin composition is desirable. As an example of the overcoat layer, ones described in paragraphs 0018 to 0028 of JP-A No. 2003-287618 and, as commercially available one of the overcoat agent, Optomer-SS6699G (trade name, manufactured by JSR Corporation) are cited.

—Color Filter—

A color filter of the invention is constituted of colored pixels of red (R), green (G) and blue (B).

The photosensitive resin layers of red (R), green (G) and blue (B), respectively, preferably include a combination of C.I.P.R.254 and C.I.P.R.177, a combination of C.I.P.G.36 and C.I.P.Y.150 and a combination of C.I.P.B.15:6 and C.I.P.V.23.

The color filter of the invention is produced according to a known process such as a process where a photosensitive resin layer is formed on a substrate, followed by exposing and developing is repeated by the number of colors. As needs arise, a structure where a boundary is demarcated by the black matrix may be formed.

<<Substrate for Display Device>>

A substrate for display device of the invention is obtained by disposing a member for a display device formed with a photosensitive transfer material of the invention.

For instance, when a spacer as the member for a display device is disposed on a display light shielding portion or a driving device, the member for a display device of the invention is prepared in such a manner that, so that previously disposed light shielding portion or driving device may be covered, the photosensitive transfer material of the invention is laminated as mentioned above, followed by peeling and transferring, further followed by exposing and developing to form a spacer.

<<Liquid Crystal Display Element>

A liquid crystal display element is an element having a liquid crystal layer where a liquid crystal material is encapsulated between a pair of opposing substrates.

[Display Device]

A display device of the invention means a display device such as a liquid crystal display device, a plasma display device, an EL display device and a CRT display device. Definitions of the display devices and descriptions of the respective display devices are described in, for instance, "Electronic Display Device (written by Akio Sasaki, and published by Kogyo Chosakai Publishing Inc. in 1990)", and "Display Devices (written by Naotaka Ibuki, and published by Sangyo Tosho in 1989).

Among the display devices of the invention, a liquid crystal display device is particularly preferable. A liquid crystal display device is described in, for example, "Next-Generation Liquid Crystal Display Technology (edited by Tatsuo Uchida, and published by Kogyo Chosakai Publishing Inc. in 1994)". A liquid crystal display device to which the invention is applied is not particularly restricted. The invention is applied to various types of liquid crystal display devices described in, for example, the "Next-Generation Liquid Crystal Display Technology". Among them, the invention is particularly effective in color TFT liquid crystal display devices. The color TFT liquid crystal display devices are described in, for instance, "Color TFT Liquid Crystal Displays (published by Kyoritsu Shuppan Co., Ltd. in 1996)". The invention may also be applied to liquid crystal display devices with an extended visual field angle such as those driven in a horizontal electric field drive mode such as IPS and those driven in a pixel division mode such as MVA. These modes are described in, for example, "Current Trend in Technology and Market of EL, PDP, and LCD Displays" (published by Toray Research Center Inc., Technical Survey Dept. in 2001)" p. 43.

A liquid crystal display device includes, other than a color filter, various members such as an electrode substrate, a polarization film, a phase difference film, a backlight, a spacer, a visual angle compensating film. The black matrix of the invention is applied to liquid crystal display devices that are constituted of the known members. These members are described in, for instance, "Market of Liquid Crystal Display-related Materials and Chemicals in 1994 (written by Kentaro Shima, and published by CMC Publishing in 1994)", and "2003 Current Status and Future Prospect of Liquid Crystal-related Market (2nd vol.) (written by Ryokichi Omote, and published by Fuji Chimera Research Institute, Inc. in 2003)".

[Target Applications]

The color filter of the invention is applied to a TV, a personal computer, a liquid crystal projector, a game machine, a portable terminal such as a portable telephone, a digital camera, a car navigator and so on without particular restriction.

EXAMPLES

Hereinafter, the invention will be described in more detail with reference to examples. However, it should be understood that the invention is not restricted to these examples. "Part" and "%" described below means "parts by weight" and "% by weight", unless specified otherwise.

Example 1

A thermoplastic resin layer-coating solution H1 having a composition described below was coated on a polyethylene terephthalate film serving as a temporary support and having a thickness of 75 μm and dried, thereby a thermoplastic resin layer having a thickness of 15.1 μm was formed.

<Thermoplastic Resin Layer-Coating Solution>

TABLE 1

| Thermoplastic resin layer-coating solution | H1 | H2 | H3 | H4 | H5 | H6 | H7 | H8 | H9 | H10 | H11 |
|---|---|---|---|---|---|---|---|---|---|---|---|
| Binder A | 40.0 | 40.6 | 39.3 | 33.3 | 46.6 | 40.0 | 40.0 | 40.0 | 27.5 | 32.8 | 53.3 |
| Binder B | 25.0 | 25.4 | 24.6 | 28.4 | 21.6 | 25.0 | 25.0 | 25.0 | 32.8 | 28.0 | 18.2 |
| Plasticizer 1 | 9.69 | 9.41 | 9.98 | 9.69 | 9.69 | 9.69 | 9.69 | 9.69 | 9.12 | 9.98 | 9.69 |
| Surfactant 1 | 0.54 | 0.54 | 0.54 | 0.54 | 0.54 | 0.54 | 0.54 | 0.54 | 0.54 | 0.54 | 0.54 |
| Methyl ethyl ketone | 25 | 25 | 25 | 25 | 25 | 25 | 25 | 25 | 25 | 25 | 25 |

(Unit: Parts by weight)

<Binder A>

Methyl methacrylate/2-ethylhexyl acrylate/benzyl methacrylate/methacrylic acid copolymer (mole ratio)=55/11.7/4.5/28.8 (trade name: Aromatex FM601, manufactured by Mitsui Chemical, Inc., weight average molecular weight=90,000, solid concentration: 21% by weight)

<Binder B>

Styrene/acrylic acid copolymer (mole ratio)=63/37 (trade name: Aroset 7055, manufactured by Nihon Shokubai Co., Ltd., weight average molecular weight: 8000, solid concentration: 41% by weight)

<Plasticizer 1>

2,2-bis[4-(methacryloxypolyethoxy)phenyl]propane (manufactured by Shin-Nakamura Chemical Co. Ltd.)

<Surfactant 1>

| Structure 1 below | 30% |
| Methyl ethyl ketone | 70% |

Structure 1

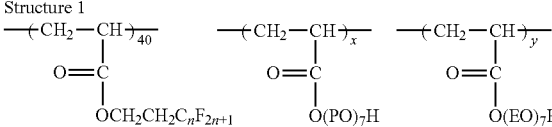

(n = 6, x = 55, y = 5, Mw = 33940, Mw/Mn = 2.55, PO: propylene oxide, EO: ethylene oxide)

In the next place, on the thermoplastic resin layer, an intermediate layer-coating solution B1 having a composition below was coated and dried, thereby, an intermediate layer having a thickness of 1.6 μm was formed.

<Intermediate Layer-Coating Solution B1>

| Polyvinyl alcohol (trade name: PVA205 (saponification degree = 88%), manufactured by Kuraray Co., Ltd.) | 2.1 parts |
| Polyvinyl pyrolidone (trade name: PVP, K-30, manufactured by ISP Japan Ltd) | 0.95 parts |
| Methanol | 44 parts |
| Distilled water | 53 parts |

Furthermore, a deep-colored composition K1 prepared according to a producing process of a deep-colored composition shown below was coated and dried, thereby, a photosensitive resin layer having a thickness of 2.4 μm was formed.

[Producing Process of Deep-Colored Composition]

A deep-colored composition K1 is obtained in such a manner that, in the beginning, a K pigment dispersion 1 and propylene glycol monomethyl ether acetate (trade name: MMPG-Ac, manufactured by Daicel Chemical Industries, Ltd., same below) were measured by amounts described in Table 2, followed by mixing at 150 RPM at 24° C. (±2° C.) for 10 min, further followed by measuring methyl ethyl ketone, a binder 2, hydroquinone monomethyl ether, a DPHA solution, 2,4-bis(trichloromethyl)-6-[4-(N,N-diethoxycarbonylmethyl)amino-3-bromophenyl]-s-triazine and a surfactant 1 by amounts described in Table 2, still further followed by adding in this order at 25° C. (±2° C.) and agitating at 40° C. (±2° C.) and 150 RPM for 30 min. Amounts described in Table 2 are based on weight and, in detail, a composition is as shown below.

<K Pigment Dispersion 1>

| | |
|---|---|
| Carbon black (trade name: Nipex 35, manufactured by Degussa AG) | 13.1% |
| Dispersing agent (compound 1 below) | 0.65% |

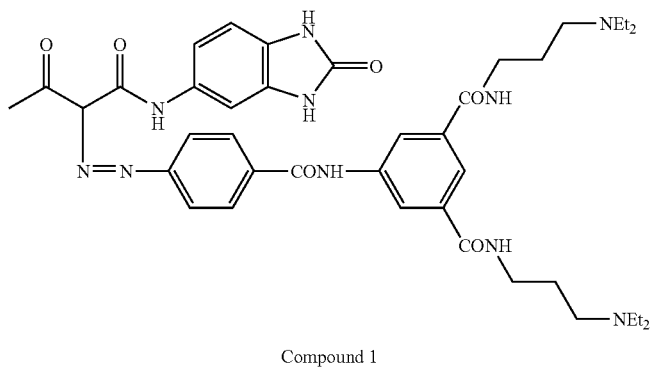

Compound 1

| | |
|---|---|
| Polymer (random copolymer of benzyl methacrylate/methacrylic acid = 72/28 (mole ratio), molecular weight: 37,000) | 6.72% |
| Propylene glycol monomethyl ether acetate | 79.53% |

<Binder 2>

| | |
|---|---|
| Polymer (random copolymer of benzyl methacrylate/methacrylic acid = 78/22 (mole ratio), molecular weight: 38,000) | 27% |
| Propylene glycol monomethyl ether acetate | 73% |

<DPHA Solution>

| | |
|---|---|
| Dipentaerythritol hexaacrylate (containing 500 ppm of polymerization inhibitor MEHQ, trade name: KAYARAD DPHA, manufactured by Nippon Kayaku Co., Ltd.) | 76% |
| Propylene glycol monomethyl ether acetate | 24% |

TABLE 2

| Deep Colored Composition | K1 | K2 |
|---|---|---|
| K Pigment dispersion 1 (Carbon Black) | 25 | 30 |
| Propylene glycol monomethyl ether acetate | 8.0 | 7.3 |
| Methyl ethyl ketone | 53 | 34 |
| Cyclohexanone | 0 | 8.6 |
| Binder 2 | 9.1 | 14 |
| DPHA solution | 4.2 | 5.8 |
| 2,4-bis(trichloromethyl)-6-[4'-(N,N-bisethoxycarbonylmethyl)amino-3'-bromophenyl]-s-triazine | 0.16 | 0.22 |
| Hydroquinone monomethyl ether | 0.002 | 0 |
| Phenothiazine | 0 | 0.006 |
| Surfactant 1 | 0.044 | 0.058 |

(Part by weight)

On the photosensitive resin layer, a polypropylene cover film (thickness: 12 μm) was adhered by pressure bonding, thereby, a photosensitive transfer material K1 was prepared.

A alkali-free glass substrate was washed by use of a nylon-haired rotary brush while spraying a glass cleaning liquid controlled at 25° C. for 20 sec from a shower, followed by washing by showering pure water, further followed by spraying a silane coupling solution (aqueous solution of 0.3% by weight of N-β(aminoethyl)γ-aminopropyltrimethoxy silane, trade name: KBM603, manufactured by Shin-Etsu Chemical Co., Ltd.) for 20 sec from a shower, followed by showering pure water. The substrate was heated in a substrate pre-heater for 2 min at a substrate temperature described in Table 4.

On a silane coupling treated glass substrate thus obtained, a surface of an exposed photosensitive resin layer obtained by removing a cover film from the photosensitive transfer material K1 prepared according to the above producing process was superposed so as to come into contact with a surface of the silane coupling treated glass substrate, followed by laminating, by use of a laminator shown in FIG. 2, on a substrate heated at the 100° C. for 2 min, under conditions of a rubber roller temperature of 130° C., line pressure of 100 N/cm and a conveyer speed of 2.2 m/min.

Figure 3:
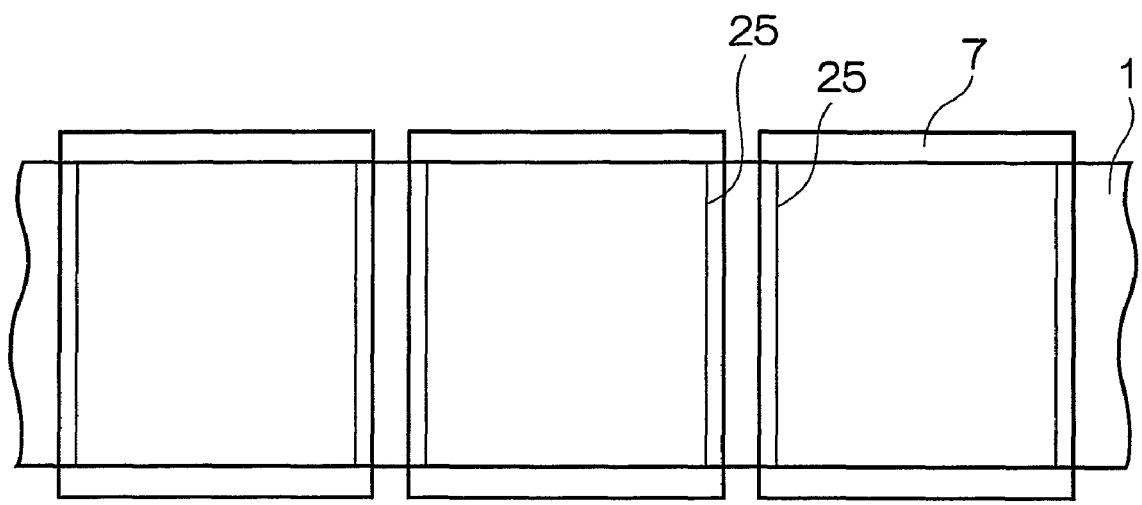
FIG. 3 is a schematic plan view showing a half-cut line of a device shown in FIG. 2.

The photosensitive transfer material K1 (photosensitive transfer material 1) was delivered from a film original fabric 11 and a half-cut mechanism 12 shown in FIG. 2 cut a cover film, a thermoplastic resin layer, an intermediate layer, a photosensitive resin layer and part of a temporary support as shown in FIG. 3. As shown in FIG. 3, a half-cut was applied by use of a couple of blade. The half-cut was two half-cut lines 25 having a separation a little wider than a separation of substrates 7 at the continuous lamination.

From a film having half-cut lines, by use of a cover film peeling mechanism 13 shown in FIG. 2, only a cover film of a region that was adhered to the substrate 7 was peeled. That is, with a cover film only of a portion corresponding to a separation of adjacent substrates remained, the photosensitive transfer material K1 was delivered to a laminate roller 14 and laminated on the glass substrate heated at 100° C. with a surface to be laminated held downward.

The substrates were sequentially delivered from a former step with a separation of 30 to 40 mm, and, after the lamination, as shown in FIG. 2, laminated bodies separated by a definite separation were cooled to 30° C. or less in a cooling zone 16. Here, cold air cooled by a cooler was blown. Thereafter, while clamping by an upper roll 19 and a peeling roll 17, a temporary support was continuously peeled and substrates to which a photosensitive resin layer was adhered were delivered to a next step. A peeled temporary support 20 was wound by a winding roller 21.

After the temporary support was peeled, by use of a proximity exposure apparatus (manufactured by Hitachi High-Tec Engineering Ltd.) incorporated an ultrahigh pressure mercury lamp, with the substrate and a mask (a quartz exposure mask with an image pattern) erected vertical and with a distance between a surface of the exposure mask and the thermoplastic resin layer kept at 200 μm, pattern exposure was applied at an exposure amount of 70 mJ/cm$^2$.

In the next place, a triethanolamine-based developing solution (liquid obtained by diluting 30% triethanolamine-containing T-PD2 (trade name, manufactured by Fuji Photo Film Co., Ltd.) at 12 times with pure water) was showered at 30° C. for 50 sec under flat nozzle pressure of 0.04 MPa to develop, thereby, the thermoplastic resin layer and the intermediate layer were removed.

Subsequently, a sodium carbonate-based developing solution (liquid obtained by diluting 0.38 mole/l of sodium hydrogen carbonate, 0.47 mole/l of sodium carbonate, 5% of sodium dibutylnaphthalene sulfonate, an anionic surfactant, a defoaming agent and a stabilizer-containing T-CD1 (trade name, manufactured by Fuji Photo Film Co., Ltd.) at 5 times with pure water) was showered at 29° C. for 30 sec under cone nozzle pressure of 0.15 MPa to develop, thereby, a photosensitive resin layer were developed and patterned pixels were obtained.

In the next place, by use of a liquid obtained by diluting a cleaning agent T-SD3 (trade name, manufactured by Fuji Photo Film Co., Ltd.) at 10 times with pure water, at 33° C. for 20 sec under cone nozzle pressure of 0.02 MPa, a shower and a nylon-haired rotary brush were used to remove residue, thereby, an image of black (K) was obtained.

Further thereafter, to the substrate, from a side of the photosensitive resin layer, the post exposure was applied at 500 mJ/cm$^2$ by use of an ultrahigh pressure mercury lamp, followed by heat treating at 220° C. for 15 min, thereby, a black matrix having a height of 2.0 μm was obtained.

[Plasma Water-Repelling Treatment]

To a substrate on which a black matrix was formed, by use of a cathode-coupling parallel plate plasma treatment apparatus, a plasma water repelling treatment was applied under conditions below.

Gas used: CF$_4$ gas, flow rate: 80 sccm
Pressure: 40 Pa
RF power: 50 W
Treatment time: 30 sec —Preparation of Colored Ink for Pixel—

Among components below, in the beginning, a pigment, a high molecular weight dispersing agent and a solvent were mixed and a three-roll mill and beads mill were used to prepare a pigment dispersion. While thoroughly agitating the pigment dispersion by a dissolver or the like, other materials were added a little at a time to prepare a red (R) pixel-forming colored ink composition.

<Composition of Red Pixel-Forming Colored Ink>

| | |
|---|---|
| Pigment (C.I. Pigment Red 254) | 5 parts |
| High-molecular weight dispersion agent (trade name: Solsperse 24000, manufactured by Avecia Co., Ltd.) | 1 parts |
| Binder (random copolymer of benzyl methacrylate/ methacrylic acid (=72/28 [mole ratio]), weight average molecular weight: 37,000) | 3 parts |
| First epoxy resin (novolak epoxy resin, trade name: Epicoat 154, manufactured by Yuka-Shell K.K.) | 2 parts |
| Second epoxy resin (neopentyl glycol diglycidyl ether) | 5 parts |
| Curing agent (trimellitic acid) | 4 parts |
| Solvent (ethyl 3-ethoxypropionate) | 80 parts |

Furthermore, except that, in place of C.I. Pigment Red 254 in the composition, an equal amount of C.I. Pigment Green 36 was used, similarly to the case of the red pixel-forming colored ink composition, a green (G) pixel-forming colored ink composition was prepared.

Still furthermore, except that, in place of C.I. Pigment Red 254 in the composition, an equal amount of C.I. Pigment Blue 15:6 was used, similarly to the case of the red pixel-forming colored ink composition, a blue (B) pixel-forming colored ink composition was prepared.

In the next place, by use of the R, G and B pixel-forming colored ink compositions described above, in a region demarcated by the black matrix (a concave portion surrounded by a convex portion) of the above-obtained color filter substrate, by use of an inkjet recording device, the ink composition was discharged until desired density was obtained, thereby, a color filter made of patterns of R, G and B was prepared. An image colored color filter was baked in an oven set at 230° C. for 30 min, and, thereby, the black matrix and the respective pixels were completely cured.

The ink that constitutes each of pixels of thus obtained color filter just fitted in the black matrix gap; accordingly, defects that become flaws such as bleeding, overrun, color mixture with an adjacent pixel and a void were not found.

On the R pixels, G pixels and B pixels and the black matrix of the color filter substrate obtained in the above, a transparent electrode made of ITO (Indium Tin Oxide) was further formed by sputtering.

By use of a prescription T1 below of a photosensitive resin layer-coating solution for spacers, according to a process similar to the above, a photosensitive transfer material T1 was prepared, followed by transferring on the ITO of the color filter, thereby, a photosensitive resin layer was formed.

[Prescription T1 of Photosensitive Resin Layer-Coating Solution]

| | |
|---|---|
| Copolymer of methacrylic acid/aryl methacrylate (mole ratio = 20/80, weight average molecular weight: 40,000; high molecular weight material) | 108 parts |
| Dipentaerythritol hexaacrylate (polymerizable monomer) | 64.7 parts |
| 2,4-bis(trichloromethyl)-6-[4'-(N,N-bisethoxycarbonylmethyl)amino-3'-bromophenyl]-s-triazine | 6.24 parts |
| Hydroquinone monomethyl ether | 0.0336 parts |
| Victoria pure blue BOHM (trade name, manufactured by Hodogaya Chemical Co., Ltd.) | 0.874 parts |
| Megaface F780F (trade name, manufactured by DIC Corporation; surfactant) | 0.856 parts |
| Methyl ethyl ketone | 328 parts |
| 1-methoxy-2-propyl acetate | 475 parts |
| Methanol | 16.6 parts |

In the next place, a surface of a thermoplastic resin layer was proximity exposed through a predetermined photomask with a distance of 40 μm between the surface of a thermoplastic resin layer and the predetermined photomask by use of an ultrahigh pressure mercury lamp at 70 mJ/cm$^2$. After the exposure, by use of a KOH development solution [obtained by diluting CDK-1 (trade name, manufactured by Fuji Photo Film Co., Ltd.) at 100 times (pH=11.8)], a photosensitive resin layer of an unexposed portion was dissolved and removed.

Subsequently, the baking was carried out at 230° C. for 30 min, thereby, on a portion of an ITO film above a glass substrate located at an upper portion of a partition wall, pillared spacer patterns having a diameter of 16 μm and an average height of 3.7 μm were formed. Thereon, an orientation film made of polyimide was further disposed.

(Formation of Liquid Crystal Orientation-Controlling Projection)

According to a prescription A1 below for a photosensitive resin layer-coating solution for a liquid crystal orientation-controlling projection, similarly to the process mentioned above, a photosensitive transfer material A1 was prepared, followed by transferring on the ITO of the color filter side substrate, thereby, a photosensitive resin layer for liquid crystal orientation-controlling projections was formed.

[Photosensitive Resin Layer Coating Solution for Liquid Crystal Orientation-controlling Projection: Prescription A1]

| | |
|---|---|
| Positive resist liquid (trade name: FH-2413F, manufactured by Fuji Film Electronics Materials Co., Ltd.) | 53.3 parts |
| Methyl ethyl ketone | 46.7 parts |
| Surfactant 1 mentioned above | 0.04 parts |

Then, a proximity exposing apparatus was disposed so that a photomask may be located at 100 μm from a surface of a thermoplastic resin layer, followed by proximity exposing through the photomask by use of an ultrahigh pressure mercury lamp at illumination energy of 150 mJ/cm$^2$. Thereafter, an aqueous solution of 2.38% tetramethylammonium hydroxide was sprayed at 33° C. for 30 sec to the substrate by use of a shower type developing apparatus to develop, and, thereby, an unnecessary portion (exposed portion) of the photosensitive resin layer for projections was developed and removed. Then, on a portion of the ITO film of the color filter side substrate located at an upper portion of R, G and B pixels, projections made of a photosensitive resin layer patterned into a desired shape were formed. Subsequently, the color filter side substrate on which the projections were formed was baked at 240° C. for 50 min, thereby, on the color filter side substrate, a liquid crystal orientation-controlling projection having a height of 1.5 μm and a barrel-like cross-sectional shape was formed.

Furthermore, to the color filter side substrate obtained above, a drive side substrate and a liquid crystal material were combined to prepare a liquid crystal display device. That is, as a drive side substrate, a TFT substrate on which TFTs and pixel electrodes (conductive layer) are arranged and formed was prepared, a surface on a side where pixel electrodes of the TFT substrate are disposed and a surface on a side where orientation partition projections of the color filter substrate are formed were disposed so as to face each other and fixed with a gap due to the spacers formed in the above. In the gap, a liquid crystal material was encapsulated to dispose a liquid crystal layer that works as an image display. On each of both sides of thus obtained liquid crystal cell, a polarization plate HLC2-2518 (trade name, manufactured by Sanritz Corporation) was adhered. Then, a backlight of a three-wavelength cold cathode light source (trade name: FWL18EX-N, manufactured by Toshiba Lighting & Technology Corporation) was constituted and disposed on a side that is a back surface of a liquid crystal cell to which the polarization plate was disposed, thereby, a liquid crystal display device was formed.

Example 2

Except that, in example 1, a thermoplastic resin layer-coating solution H1 was changed to a thermoplastic resin layer-coating solution H2 described in Table 1, similarly to a process of example 1, a liquid crystal display device was prepared.

Example 3

Except that, in example 1, a thermoplastic resin layer-coating solution H1 was changed to a thermoplastic resin layer-coating solution H3 described in Table 1, similarly to a process of example 1, a liquid crystal display device was prepared.

Example 4

Except that, in example 1, a thermoplastic resin layer-coating solution H1 was changed to a thermoplastic resin layer-coating solution H4 described in Table 1, similarly to a process of example 1, a liquid crystal display device was prepared.

Example 5

Except that, in example 1, a thermoplastic resin layer-coating solution H1 was changed to a thermoplastic resin layer-coating solution H5 described in Table 1, similarly to a process of example 1, a liquid crystal display device was prepared.

Example 6

Except that, in example 1, a thermoplastic resin layer-coating solution H1 was changed to a thermoplastic resin layer-coating solution H6 described in Table 1 and a film thickness was changed to a film thickness described in Table 4, similarly to a process of example 1, a liquid crystal display device was prepared.

Example 7

Except that, in example 1, a thermoplastic resin layer-coating solution H1 was changed to a thermoplastic resin layer-coating solution H7 described in Table 1 and a film thickness was changed to a film thickness described in Table 4, similarly to a process of example 1, a liquid crystal display device was prepared.

Example 8

Except that, in example 1, a thermoplastic resin layer-coating solution H1 was changed to a thermoplastic resin layer-coating solution H8 described in Table 1 and a substrate heating temperature was changed to a temperature described in Table 4, similarly to a process of example 1, a liquid crystal display device was prepared.

Comparative Example 1

Except that, in example 1, a thermoplastic resin layer-coating solution H1 was changed to a thermoplastic resin layer-coating solution H9 described in Table 1, similarly to a process of example 1, a liquid crystal display device was prepared.

Comparative Example 2

Except that, in example 1, a thermoplastic resin layer-coating solution H1 was changed to a thermoplastic resin layer-coating solution H10 described in Table 1, similarly to a process of example 1, a liquid crystal display device was prepared.

Comparative Example 3

Except that, in example 1, a thermoplastic resin layer-coating solution H1 was changed to a thermoplastic resin layer-coating solution H11 described in Table 1, similarly to a process of example 1, a liquid crystal display device was prepared.

Example 9

Except that, in example 1, a process of forming a colored pixel was changed to a transfer process described below, similarly to a process of example 1, a liquid crystal display device was prepared.

By use of a process where the deep-colored composition K1 used in preparing the photosensitive transfer material K1 was changed to colored photosensitive resin compositions R1, G1 and B1 that are made of compositions described in Table 3 described below and others than that were carried out similarly to a process of that of the deep-colored composition K1, photosensitive transfer materials R1, G1 and B1 were prepared.

—Formation of Red (R) Pixel—

On a substrate on which a black matrix was formed according to a process similar to example 1, with the photosensitive transfer material R1, according to a step similar to that of the photosensitive transfer material K1, red(R) pixels were obtained. Here, an exposure amount was set at 40 mJ/cm$^2$ and development was carried out with a sodium carbonate-based development solution at 35° C. for 35 sec.

A film thickness of the photosensitive resin layer R1 was 2.0 μm and coated amounts of pigments of C.I. Pigment Red 254 and C.I. Pigment Red 177, respectively, were 0.88 g/m$^2$ and 0.22 g/m$^2$.

The substrate on which the R pixels were formed was once more washed by use of a brush as mentioned above, after washing by use of a pure water shower, without using a silane coupling solution, followed by heating at 100° C. for 2 min by means of a substrate preheater.

—Formation of Green (G) Pixels—

On a substrate on which the red (R) pixels were formed, according to a process similar to that of the photosensitive transfer material R1, green (G) pixels were formed from the photosensitive transfer material G1. Here, an exposure amount was set at 40 mJ/cm$^2$, and development was carried out with a sodium carbonate-based development solution at 34° C. for 45 sec.

A film thickness of the photosensitive resin layer G1 was 2.0 μm and coated amounts of pigments of C.I. Pigment Green 36 and C.I. Pigment Yellow 150, respectively, were 1.12 g/m$^2$ and 0.48 g/m$^2$.

The substrate on which the image of R and G were formed was once more washed by use of a brush as mentioned above, after washing by use of a pure water shower, without using a silane coupling solution, followed by heating at 100° C. for 2 min by means of a substrate preheater.

—Formation of Blue (B) Pixels—

On a substrate on which the red (R) pixels and green (G) pixels were formed, according to a process similar to that of the photosensitive transfer material R1, blue (B) pixels were formed from the photosensitive transfer material B1. Here, an exposure amount was set at 30 mJ/cm$^2$, and development was carried out with a sodium carbonate-based development solution at 36° C. for 40 sec.

A film thickness of the photosensitive resin layer B1 was 2.0 μm and coated amounts of pigments of C.I. Pigment Blue 15:6 and C.I. Pigment Violet 23, respectively, were 0.63 g/m$^2$ and 0.07 g/m$^2$.

The substrate on which the R, G and B pixels and black matrix were formed was once more washed by use of a brush as mentioned above, after washing by use of a pure water shower, without using a silane coupling solution, followed by heating at 100° C. for 2 min by means of a substrate preheater.

The substrate on which the R, G and B pixels and an image of K were formed was baked at 240° C. for 50 min, and, thereby, a targeted color filter was obtained.

TABLE 3

| Colored photosensitive resin composition | R1 | G1 | B1 |
| --- | --- | --- | --- |
| R pigment dispersion 1 (C.I.P.R. 254) | 44 | — | — |
| R pigment dispersion 2 (C.I.P.R. 177) | 5.0 | — | — |
| G pigment dispersion 1 (C.I.P.G. 36) | — | 24 | — |
| Y pigment dispersion 1 (C.I.P.Y. 150) | — | 13 | — |
| B pigment dispersion 1 (C.I.P.B. 15:6) | — | — | 7.2 |
| B pigment dispersion 2 (C.I.P.B. 15:6 + C.I.P.V. 23) | — | — | 13 |
| Propylene glycol monomethyl ether acetate | 7.6 | 29 | 23 |
| Methyl ethyl ketone | 37 | 26 | 35 |
| Cyclohexanone | — | 1.3 | — |
| Binder-1 | 0.8 | — | — |
| Binder-2 | — | 3 | — |
| Binder-3 | — | — | 17 |
| DPHA solution | 4.4 | 4.3 | 3.8 |
| 2-trichloromethyl-5-(p-styrylstyryl)1,3,4-oxadiazole | 0.14 | 0.15 | 0.15 |
| 2,4-bis(trichloromethyl)-6-[4-(N,N-bisethoxycarbonylmethyl)amino-3-bromophenyl]-s-triazine | 0.058 | 0.060 | — |
| Phenothiazine | 0.010 | 0.005 | 0.020 |
| Additive 1 | 0.52 | — | — |
| Surfactant 1 | 0.060 | 0.070 | 0.050 |

(Parts by weight)

A colored photosensitive resin composition R1 was obtained in such a manner that, in the beginning, a R pigment dispersion 1, a R pigment dispersion 2 and propylene glycol monomethyl ether acetate were measured by amounts described in Table 3, followed by mixing and agitating at 150 rpm at 24° C. (±2° C.) for 10 min, further followed by measuring methyl ethyl ketone, a binder 1, a DPHA solution, 2-trichloromethyl-5-(p-styrylstyryl)-1,3,4-oxadiazole, 2,4-bis(trichloromethyl)-6-[4-(N,N-bisethoxycarbonylmethyl)amino-3-bromophenyl]-s-triazine and phenothiazine by amounts described in Table 3, still further followed by adding in this order at 24° C. (±2° C.) and agitating at 150 rpm for 30 min, still further followed by measuring an additive 1 and a surfactant 1 by amounts shown in Table 3, followed by adding at 24° C. (±2° C.), further followed by agitating at 30 rpm for 5 min, still further followed by filtering by use of a #200 nylon mesh.

A composition of a R pigment dispersion 1 of the compositions described in Table 3 is as follows.

| | |
| --- | --- |
| C.I.P.R. 254 (trade name: Irgaphor Red B-CF, manufactured by Ciba Specialty Chemicals Inc.) | 8 parts |
| N,N'-bis-(3-diethylaminopropyl)-5-{4-[2-oxo-1-(2-oxo-2,3-dihydro-1H-benzoimidazol-5-ylcarbamoyl)-propylazo]-benzoylamino}-isophthalamide | 0.8 parts |

| | |
|---|---|
| Polymer (random copolymer of benzyl methacrylate/methacrylic acid = 72/28 (mole ratio), weight average molecular weight: 37,000) | 8 parts |
| Propylene glycol monomethyl ether acetate | 83.2 parts |

Furthermore, a composition of a R pigment dispersion 2 as follows.

| | |
|---|---|
| C.I.P.R. 177 (trade name: Cromophtal Red A2B, manufactured by Ciba Specialty Chemicals Inc.) | 18 parts |
| Polymer (random copolymer of benzyl methacrylate/methacrylic acid = 72/28 (mole ratio), weight average molecular weight: 37,000) | 12 parts |
| Propylene glycol monomethyl ether acetate | 70 parts |

The composition was dispersed by use of Motor Mill M-50 (trade name, manufactured by Eiger Japan K. K.) and zirconia beads having a diameter of 0.65 mm at a peripheral speed of 9 m/s for 27 hr, and, thereby a pigment dispersion composition was prepared.

A colored photosensitive resin composition G1 was obtained in such a manner that, in the beginning, a G pigment dispersion 1, a Y pigment dispersion 1 and propylene glycol monomethyl ether acetate were measured by amounts described in Table 3, followed by mixing and agitating at 150 rpm at 24° C. (±2° C.) for 10 min, further followed by measuring methyl ethyl ketone, cyclohexanone, a binder 2, a DPHA solution, 2-trichloromethyl-5-(p-styrylstyryl)-1,3,4-oxadiazole, 2,4-bis(trichloromethyl)-6-[4-(N,N-bisethoxycarbonylmethyl)amino-3-bromophenyl]-s-triazine and phenothiazine by amounts described in Table 3, still further followed by adding in this order at 24° C. (±2° C.) and agitating at 150 rpm for 30 min, further followed by measuring a surfactant 1 by an amount described in Table 3, further followed by adding at 24° C. (±2° C.), still further followed by agitating at 30 rpm for 5 min, further followed by filtering by use of a #200 nylon mesh.

Among the compositions described in Table 3, as a G pigment dispersion 1, GT-2 (trade name, manufactured by Fuji Film Electronics Materials Co., Ltd.) was used.

Furthermore, as a Y pigment dispersion 1, CF Yellow EX3393 (trade name, manufactured by Mikuni Color Ltd.) was used.

The composition was dispersed by use of Motor Mill M-50 (trade name, manufactured by Eiger Japan K. K.) and zirconia beads having a diameter of 0.65 mm at a peripheral speed of 9 m/s for 28 hr, and, thereby a pigment dispersion composition was prepared.

A colored photosensitive resin composition B1 was obtained in such a manner that, in the beginning, a B pigment dispersion 1, a B pigment dispersion 2 and propylene glycol monomethyl ether acetate were measured by amounts described in Table 3, followed by mixing and agitating at 150 rpm at 24° C. (±2° C.) for 10 min, further followed by measuring methyl ethyl ketone, a binder 3, a DPHA solution, 2-trichloromethyl-5-(p-styrylstyryl)-1,3,4-oxadiazole and phenothiazine by amounts described in Table 3, still further followed by adding in this order at 25° C. (±2° C.) and agitating at 150 RPM for 30 min at 40° C. (±2° C.), further followed by measuring a surfactant 1 by an amount described in Table 3, followed by adding at 24° C. (±2° C.), further followed by agitating at 30 rpm for 5 min, still further followed by filtering by use of a #200 nylon mesh.

Among the compositions described in Table 3, as a B pigment dispersion 1, CF Blue EX3357 (trade name, manufactured by Mikuni Color Ltd.) was used. As a B pigment dispersion 2, CF Blue EX3383 (trade name, manufactured by Mikuni Color Ltd.) was used.

<Binder 1>

| | |
|---|---|
| Polymer (random copolymer of benzyl methacrylate/methacrylic acid/methyl methacrylate = 38/25/37 (mole ratio), weight average molecular weight: 38,000) | 27 parts |
| Propylene glycol monomethyl ether acetate | 73 parts |

<Binder 3>

| | |
|---|---|
| Polymer (random copolymer of benzyl methacrylate/methacrylic acid/methyl methacrylate = 36/22/42 (mole ratio), weight average molecular weight: 38,000) | 27 parts |
| Propylene glycol monomethyl ether acetate | 73 parts |

Example 10

Except that, in example 9, a thermoplastic resin layer-coating solution H1 was changed to a thermoplastic resin layer-coating solution H2 described in Table 1, similarly to a process of example 9, a liquid crystal display device was prepared.

Example 11

Except that, in example 9, a thermoplastic resin layer-coating solution H1 was changed to a thermoplastic resin layer-coating solution H3 described in Table 1, similarly to a process of example 9, a liquid crystal display device was prepared.

Example 12

Except that, in example 9, a thermoplastic resin layer-coating solution H1 was changed to a thermoplastic resin layer-coating solution H4 described in Table 1, similarly to a process of example 9, a liquid crystal display device was prepared.

Example 13

Except that, in example 9, a thermoplastic resin layer-coating solution H1 was changed to a thermoplastic resin layer-coating solution H5 described in Table 1, similarly to a process of example 9, a liquid crystal display device was prepared.

Example 14

Except that, in example 9, a thermoplastic resin layer-forming coating solution H1 was changed to a thermoplastic resin layer-coating solution H6 described in Table 1 and a film thickness was changed to a film thickness described in Table 3, similarly to a process of example 9, a liquid crystal display device was prepared.

Example 15

Except that, in example 9, a thermoplastic resin layer-forming coating solution H1 was changed to a thermoplastic resin layer-coating solution H7 described in Table 1 and a film thickness was changed to a film thickness described in Table 3, similarly to a process of example 9, a liquid crystal display device was prepared.

Example 16

Except that, in example 9, a thermoplastic resin layer-forming coating solution H1 was changed to a thermoplastic resin layer-coating solution H8 described in Table 1 and a substrate heating temperature was changed to a temperature described in Table 4, similarly to a process of example 9, a liquid crystal display device was prepared.

Example 17

Except that, in example 1, a deep-colored composition K1 was changed to a deep-colored composition K2 described in Table 2, similarly to a process of example 1, a liquid crystal display device was prepared.

Comparative Example 4

Except that, in example 9, a thermoplastic resin layer-coating solution H1 was changed to a thermoplastic resin layer-coating solution H9 described in Table 1, similarly to a process of example 9, a liquid crystal display device was prepared.

Comparative Example 5

Except that, in example 9, a thermoplastic resin layer-coating solution H1 was changed to a thermoplastic resin layer-coating solution H10 described in Table 1, similarly to a process of example 9, a liquid crystal display device was prepared.

Comparative Example 6

Except that, in example 9, a thermoplastic resin layer-coating solution H1 was changed to a thermoplastic resin layer-coating solution H11 described in Table 1, similarly to a process of example 9, a liquid crystal display device was prepared.

<Evaluation>
[Measurement of Melt Viscosity]
A thermoplastic resin layer-coating solution was coated on a glass plate, dried in air, followed by drying at 45° C. for 4 hr in a vacuum, further followed by peeling off the glass plate to obtain a sample. In measuring, a viscoelastometer DynAlyster DAS-100 (trade name, manufactured by Jasco International Co., Ltd.) was used at a measurement temperature of 110° C. and a measurement frequency of 1 Hz. Measurement results are shown in Table 4.

[Breaking Strength or Yield Stress, Elongation at Break]
Both surfaces of a Teflon (registered trademark) (polytetrafluoroethylene) sheet were processed at room temperature by use of a solid state corona processor model 6 KVA (trade name, manufactured by Pillar Inc.) so that a contact angle with water may be less than 90°. Then, a thermoplastic resin layer-coating solution was coated on the processed Teflon (registered trademark) (polytetrafluoroethylene) sheet, dried in air, followed by drying at 100° C. for 15 min, thereby, a model film of a thermoplastic resin layer-coating solution having a thickness of substantially 15 μm was formed. The model film was cut into 20 mm×5 mm to prepare a sample, followed by applying a tensile test by use of Tensilon RTM-100 (trade name, manufactured by Orientec Corp.), and further followed by calculating the breaking strength and elongation at break. Calculation results are shown in Table 4.

The breaking strength is the strength when the sample was broken (obtained by normalizing the stress at break by a sample cross section area before the tensile test) and the elongation at break (%) was obtained from {(length at break (mm)/20 mm)-1}×100. Conditions of the tensile test are as follows.

Environmental temperature and humidity: 25° C./60% RH
Tensile speed: 20 mm/min (100%/min)
In Table 4, ones of which elongation at break exceeds 25% are expressed as >25%.

[Measurement of Film Thickness]
A film thickness was measured by use of a surface roughness meter P-10 (trade name, manufactured by Tencor Corporation). Measurement results are shown in Table 4.

[Color Mixture]
A substrate was observed from a pixel formation side thereof in a thickness direction by use of an optical microscope to evaluate the color mixture. Whether the color mixture is found in a pixel or not was observed at n=2 of arbitrary 100 pixels in an optical element to confirm the presence of the color mixture. Evaluation was based on evaluation criteria described below. Evaluation results are shown in Table 4.
<Evaluation Criteria>
A: Completely free from the color mixture.
B: Color mixtures being less than 3 pixels.
C: Color mixtures being 3 pixels or more and less than 5 pixels.
D: Color mixtures being 5 pixels or more and less than 10 pixels.
E: Color mixtures being more than 10 pixels.

[Pixel Unevenness]
A single color image of each of R, G and B was emitted, in a range of an area of 10 cm×10 cm, the density unevenness was observed by 20 observers and the pixel unevenness (color unevenness) was evaluated based on evaluation criteria below. Results are shown in Table 4.
<Evaluation Criteria>
A: None observer recognized the color unevenness.
B: Two observers recognized the color unevenness.
C: Four observers recognized the color unevenness.
D: Six observers recognized the color unevenness.
E: Eight or more observers recognized the color unevenness.

[Display Unevenness]
Of each of the liquid crystal display devices, the gray display when a gray test signal was inputted was observed visually and by use of a loupe, and whether the display unevenness is present or not was evaluated based on evaluation criteria below. Results are shown in Table 4.
<Evaluation Criteria>
A: Completely free from the unevenness (excellent)
B: A slight unevenness at a brim portion of a glass substrate but no problem in a display portion (good)
C: A slight unevenness in a display portion but a practically acceptable level (usual)
D: The unevenness in a display portion (a little poor)
E: Strong unevenness in a display portion (very poor)

[Peelability]
In each of the examples and comparative examples, after the temporary support was peeled, on a surface (peeled surface) of a layer left on the substrate side, light is reflected at an incident angle in the range of 30 to 60°, followed by observing visually and by use of a microscope to evaluate based on criteria below. Evaluation results are shown in Table 4.

A: A peeled surface is even and a peeling residue (residue of the thermoplastic resin layer) is not at all found, that is, the peelability is extremely excellent.
B: Although a spot-like peeling residue is slightly found at an edge portion of a temporary support, the peeling residue is not found in other portion, that is, the peelability is excellent.
C: Although a line-like peeling residue is slightly found at an edge portion of a temporary support, the peeling residue is not found in other portion, that is, the peelability is usual.
D: A slight peeling residue is generated in not only an edge portion but also the other portion, that is, the peelability is poor.
E: A peeling residue is found all over an entire surface, that is, the peelability is very poor.
The A through C levels are practically acceptable levels.

Furthermore, when colored pixels formed from the photosensitive transfer materials of the invention were used to prepare a color filter, the display unevenness was not found.

Still furthermore, a liquid crystal display device provided with spacers or liquid crystal orientation-controlling projections prepared from the photosensitive transfer materials of the invention, without showing the display unevenness, showed excellent display characteristics.

A liquid crystal display device prepared from the photosensitive resin transfer materials of the invention could provide, without display unevenness, a high quality image.

In what follows, exemplary embodiments of the invention will be described. However, the invention is not restricted thereto.

TABLE 4

| | | Thermoplastic Resin Layer | | | | | | Evaluation | | | |
| | | Melt Viscosity [Pa·S] | Breaking Strength (×10⁶ Pa) | Yield Stress (×10⁶ Pa) | Elongation at break [%] | Film Thickness [μm] | Substrate Temperature | Color Mixture | Pixel Unevenness | Display unevenness | Peelability |
| --- | --- | --- | --- | --- | --- | --- | --- | --- | --- | --- | --- |
| | Pixel | | | | | | | | | | |
| Example 1 | IJ Process | 4790 | 7.6 | — | 21% | 15.1 | 120° C. | B | — | B | B |
| Example 2 | IJ Process | 5080 | 9.4 | — | 10% | 15.1 | 120° C. | A-B | — | A-B | A-B |
| Example 3 | IJ Process | 4480 | — | 6.4 | >25% | 15.1 | 120° C. | B-C | — | B-C | B-C |
| Example 4 | IJ Process | 3390 | 8 | — | 8% | 15.1 | 120° C. | B-C | — | B-C | B-C |
| Example 5 | IJ Process | 5190 | — | 8 | >25% | 15.1 | 120° C. | A-B | — | A-B | A-B |
| Example 6 | IJ Process | 4790 | 7.6 | — | 21% | 16.6 | 120° C. | B | — | B | B |
| Example 7 | IJ Process | 4790 | 7.6 | — | 21% | 13.6 | 120° C. | B | — | B | B |
| Example 8 | IJ Process | 4790 | 7.6 | — | 21% | 15.1 | 100° C. | B-C | — | B-C | B-C |
| Example 9 | Transfer Process | 4790 | 7.6 | — | 21% | 15.1 | 120° C. | — | B | B | B |
| Example 10 | Transfer Process | 5080 | 9.4 | — | 10% | 15.1 | 120° C. | — | A-B | A-B | A-B |
| Example 11 | Transfer Process | 4480 | — | 6.4 | >25% | 15.1 | 120° C. | — | B-C | B-C | B-C |
| Example 12 | Transfer Process | 3390 | 8 | — | 8% | 15.1 | 120° C. | — | B-C | B-C | B-C |
| Example 13 | Transfer Process | 5190 | — | 8 | >25% | 15.1 | 120° C. | — | A-B | A-B | A-B |
| Example 14 | Transfer Process | 4790 | 7.6 | — | 21% | 16.6 | 120° C. | — | B | B | B |
| Example 15 | Transfer Process | 4790 | 7.6 | — | 21% | 13.6 | 120° C. | — | B | B | B |
| Example 16 | Transfer Process | 4790 | 7.6 | — | 21% | 15.1 | 100° C. | — | B-C | B-C | B-C |
| Example 17 | IJ Process | 4790 | 7.6 | — | 21% | 15.1 | 120° C. | B | — | B | B |
| Comparative Example 1 | IJ Process | 3000 | 13.4 | — | 4% | 15.1 | 120° C. | E | — | E | E |
| Comparative Example 2 | IJ Process | 3060 | — | 4 | >25% | 15.1 | 120° C. | D | — | D | D |
| Comparative Example 3 | IJ Process | 6850 | — | 9 | >25% | 15.1 | 120° C. | B | — | C-D | A |
| Comparative Example 4 | Transfer Process | 3000 | 13.4 | — | 4% | 15.1 | 120° C. | — | E | E | E |
| Comparative Example 5 | Transfer Process | 3060 | — | 4 | >25% | 15.1 | 120° C. | — | D | D | D |
| Comparative Example 6 | Transfer Process | 6850 | — | 9 | >25% | 15.1 | 120° C. | — | B | C-D | A |

From Table 4, when, with a black matrix prepared from a photosensitive transfer material of the invention, an inkjet process was used to form colored pixels to form a color filter (examples 1 through 8), the color mixture, display unevenness, display defects and the like were not found.

<1> A photosensitive transfer material that includes, on or above a temporary support, in the following order from the temporary support side, at least a thermoplastic resin layer; and a photosensitive resin layer, wherein the tensile elongation at break of the thermoplastic resin layer is 6% or more, the yield stress or breaking strength thereof is $5 \times 10^6$ Pa or more, and the melt viscosity η at 110° C. thereof is 6000 Pa·s or less.

<2> The photosensitive transfer material of the <1> that further includes an intermediate layer.

<3> The photosensitive transfer material of the <1>, wherein the thermoplastic resin layer includes at least a polymer and a plasticizer.

<4> A method for producing a member for a display device, which includes transferring the photosensitive transfer material of the <1> onto a substrate.

<5> A member for a display device produced by the method for producing a member for a display device of the <4>.

<6> A black matrix produced by the method for producing a member for a display device of the <4>.

<7> The member for a display device of the <5>, wherein the member for a display device is any one of a colored pixel, a black matrix, a spacer and a liquid crystal orientation-controlling projection.

<8> A color filter that includes, on or above a substrate, two or more colored pixel groups different in color from each other, wherein the respective colored pixels constituting the colored pixel groups are demarcated from each other by the black matrix of the <6>.

<9> The color filter of the <8>, wherein a colored pixel is formed by applying a liquid droplet of a colored liquid composition.

<10> The color filter of the <9>, wherein a process of applying the liquid droplet is an inkjet process.

<11> A method for producing a color filter, in which, including, after the black matrix of the <6> is formed, forming a colored pixel group made of a plurality of colored pixels having two or more colors, wherein the plurality of colored pixels are formed by applying a liquid droplet of a colored liquid composition <12> A substrate for a display device that is provided with the member for a display device of the <5>.

<13> A display device that is provided with the substrate for a display device of the <12>.

An entirety of a disclosure of Japanese Patent Application No. 2005-370822 is incorporated in the specification by reference.

All literatures, patent applications and technical standards described in the specification are herein incorporated by reference to the same extent as if individual literatures, patent applications and technical standards were specifically and individually indicated to be incorporated by reference.

The invention claimed is:

1. A photosensitive transfer material, comprising:
   on or above a temporary support, in the following order from the temporary support side, at least
   a thermoplastic resin layer which contains a high molecular weight polymer having a weight average molecular weight of 10,000 or more and a low molecular weight polymer having a weight average molecular weight of 3,000 or more and less than 10,0000; and
   a photosensitive resin layer,
   wherein the tensile elongation at break of the thermoplastic resin layer is 6% or more, the yield stress or breaking strength thereof is $5 \times 10^6$ Pa or more, and the melt viscosity η at 110° C. thereof is 6000 Pa·s or less, and
   wherein the weight ratio of the high molecular weight polymer to the low molecular weight polymer (high molecular weight polymer/low molecular weight polymer) is from 37.51/62.49 to 52.49/47.51.

2. The photosensitive transfer material of claim 1, further comprising an intermediate layer.

3. The photosensitive transfer material of claim 1, wherein the thermoplastic resin layer further includes a plasticizer.

4. The photosensitive transfer material of claim 3, wherein an additional amount of the plasticizer is in the range of 28 to 43% by weight relative to a solid content of the high molecular weight polymer, the low molecular weight polymer, and plasticizer contained in the thermoplastic resin layer.

5. A method for producing a member for a display device, comprising:
   transferring the photosensitive transfer material of claim 1 onto a substrate.

6. A member for a display device produced by the method for producing a member for a display device of claim 5.

7. The member for a display device of claim 6, wherein the member for a display device is any one of a colored pixel, a black matrix, a spacer and a liquid crystal orientation-controlling projection.

8. A substrate for a display device, provided with the member for a display device of claim 6.

9. A display device, provided with the substrate for a display device of claim 8.

10. A black matrix produced by the method for producing a member for a display device of claim 5.

11. A color filter, comprising:
    on or above a substrate, two or more colored pixel groups different in color from each other,
    wherein the respective colored pixels constituting the colored pixel groups are demarcated from each other by the black matrix of claim 10.

12. The color filter of claim 11, wherein a colored pixel is formed by applying a liquid droplet of a colored liquid composition.

13. The color filter of claim 12, wherein a process of applying the liquid droplet is an inkjet process.

14. A method for producing a color filter, comprising:
    after the black matrix of claim 10 is formed, forming a colored pixel group made of a plurality of colored pixels having two or more colors,
    wherein the plurality of colored pixels are formed by applying a liquid droplet of a colored liquid composition.

15. The method of claim 5, wherein the thermoplastic resin layer further includes an additional amount of plasticizer, and the additional amount of the plasticizer is in the range of 28 to 43% by weight relative to a solid content of the high molecular weight polymer, the low molecular weight polymer, and plasticizer contained in the thermoplastic resin layer.

* * * * *